(12) United States Patent
Mattela et al.

(10) Patent No.: US 11,917,924 B2
(45) Date of Patent: Feb. 27, 2024

(54) INTERLAYER EXCHANGE COUPLED MULTIPLIER

(71) Applicant: Ceremorphic, Inc., San Jose, CA (US)

(72) Inventors: Venkat Mattela, San Jose, CA (US);
Sanghamitra Debroy, Hyderabad (IN);
Santhosh Sivasubramani, Madurai (IN)

(73) Assignee: Ceremorphic, Inc., San Jose, CA (US)

( * ) Notice: Subject to any disclaimer, the term of this patent is extended or adjusted under 35 U.S.C. 154(b) by 176 days.

(21) Appl. No.: 17/234,792

(22) Filed: Apr. 19, 2021

(65) Prior Publication Data
US 2022/0336729 A1 Oct. 20, 2022

(51) Int. Cl.
*H10N 50/85* (2023.01)
*G06F 7/523* (2006.01)
*H10N 50/80* (2023.01)
*H03K 19/20* (2006.01)
*H01F 10/32* (2006.01)

(52) U.S. Cl.
CPC ............. *H10N 50/85* (2023.02); *G06F 7/523* (2013.01); *H10N 50/80* (2023.02); *H01F 10/3286* (2013.01); *H03K 19/20* (2013.01)

(58) Field of Classification Search
CPC ........ H10N 50/85; H10N 50/80; G06F 7/523; H01F 10/3286; H03K 19/20
USPC ....................................................... 257/421
See application file for complete search history.

(56) References Cited

U.S. PATENT DOCUMENTS

| | | | |
|---|---|---|---|
| 2007/0223150 A1* | 9/2007 | Fukuzawa ............ | G01R 33/093 360/324.11 |
| 2017/0092843 A1* | 3/2017 | Torok .................... | G11C 11/161 |
| 2018/0176078 A1* | 6/2018 | Nigro .................... | H04L 67/303 |
| 2018/0228410 A1* | 8/2018 | Yeh ....................... | A61B 5/0075 |
| 2022/0385565 A1* | 12/2022 | Wiser .................... | H04L 45/08 |

* cited by examiner

*Primary Examiner* — Jami Valentine Miller
(74) *Attorney, Agent, or Firm* — File-EE-Patents.com; Jay A. Chesavage

(57) ABSTRACT

A multiplier device for binary magnetic applied fields uses Interlayer Exchange Coupling (IEC) structure where two layers of ferromagnetic material are separated from each other by non-magnetic layers of electrically conductive material of atomic thickness, sufficient to generate antimagnetic response in a magnetized layer. A plurality of regions on a top surface are activated with a magnetic field in a first direction for a 1 value and in an opposite direction for a 0 value, the multiplication result presented as magnetic field direction on a plurality of output ferromagnetic regions.

20 Claims, 34 Drawing Sheets

Truth Table

| a1 | a0 | b1 | b0 | m3 | m2 | m1 | m0 |
|---|---|---|---|---|---|---|---|
| 0 | 0 | 0 | 1 | 0 | 0 | 0 | 0 |

Truth Table

| a1 | a0 | b1 | b0 | m3 | m2 | m1 | m0 |
|----|----|----|----|----|----|----|----|
| 0  | 0  | 0  | 1  | 0  | 0  | 0  | 0  |

Truth Table

| a1 | a0 | b1 | b0 | m3 | m2 | m1 | m0 |
|----|----|----|----|----|----|----|----|
| 0  | 0  | 1  | 0  | 0  | 0  | 0  | 0  |

Truth Table

| a1 | a0 | b1 | b0 | m3 | m2 | m1 | m0 |
|---|---|---|---|---|---|---|---|
| 0 | 0 | 1 | 1 | 0 | 0 | 0 | 0 |

Truth Table

| a1 | a0 | b1 | b0 | m3 | m2 | m1 | m0 |
|----|----|----|----|----|----|----|----|
| 0  | 1  | 0  | 0  | 0  | 0  | 0  | 0  |

Truth Table

| a1 | a0 | b1 | b0 | m3 | m2 | m1 | m0 |
|---|---|---|---|---|---|---|---|
| 0 | 1 | 0 | 1 | 0 | 0 | 0 | 1 |

Truth Table

| a1 | a0 | b1 | b0 | m3 | m2 | m1 | m0 |
|---|---|---|---|---|---|---|---|
| 0 | 1 | 1 | 0 | 0 | 0 | 1 | 0 |

Truth Table

| a1 | a0 | b1 | b0 | m3 | m2 | m1 | m0 |
|----|----|----|----|----|----|----|----|
| 0  | 1  | 1  | 1  | 0  | 0  | 1  | 1  |

Truth Table

| a1 | a0 | b1 | b0 | m3 | m2 | m1 | m0 |
|----|----|----|----|----|----|----|----|
| 1  | 0  | 0  | 0  | 0  | 0  | 0  | 0  |

Truth Table

| a1 | a0 | b1 | b0 | m3 | m2 | m1 | m0 |
|----|----|----|----|----|----|----|----|
| 1  | 0  | 0  | 1  | 0  | 0  | 1  | 0  |

Truth Table

| a1 | a0 | b1 | b0 | m3 | m2 | m1 | m0 |
|----|----|----|----|----|----|----|----|
| 1  | 0  | 1  | 0  | 0  | 1  | 0  | 0  |

Truth Table

| a1 | a0 | b1 | b0 | m3 | m2 | m1 | m0 |
|----|----|----|----|----|----|----|----|
| 1  | 0  | 1  | 1  | 0  | 1  | 1  | 0  |

Truth Table

| a1 | a0 | b1 | b0 | m3 | m2 | m1 | m0 |
|---|---|---|---|---|---|---|---|
| 1 | 1 | 0 | 0 | 0 | 0 | 0 | 0 |

Truth Table

| a1 | a0 | b1 | b0 | m3 | m2 | m1 | m0 |
|----|----|----|----|----|----|----|----|
| 1  | 1  | 0  | 1  | 0  | 0  | 1  | 1  |

Truth Table

| a1 | a0 | b1 | b0 | m3 | m2 | m1 | m0 |
|----|----|----|----|----|----|----|----|
| 1  | 1  | 1  | 0  | 0  | 1  | 1  | 0  |

Truth Table

| a1 | a0 | b1 | b0 | m3 | m2 | m1 | m0 |
|----|----|----|----|----|----|----|----|
| 1  | 1  | 1  | 1  | 1  | 0  | 0  | 1  |

INTERLAYER EXCHANGE COUPLED MULTIPLIER

FIELD OF THE INVENTION

The present invention relates to a logical multiplier. In particular, the invention relates to an Interlayer Exchange Coupling (IEC) multiplier formed using ferromagnetic layers separated by a spacer layer of thickness sufficient to generate anti-ferromagnetic coupling of magnetic flux across the spacer layer.

BACKGROUND OF THE INVENTION

Various device configurations have been composed using the Giant Magneto Resistive (GMR) effect, where a first ferromagnetic layer is separated from a second ferromagnetic layer by an extremely thin non-magnetic material (typically on the order of several atomic thickness of a conductor such as copper). The GMR effect results in a magnetic field in the plane of one of the ferromagnetic layers generating an anti-ferromagnetic field in the other layer, the anti-ferromagnetic field being co-planar and of opposite sense.

A multiplier device in the prior art uses semiconductor logic devices, which rely on semiconductor switching characteristics such as transconductance via field effect at an input to form the many logic elements required to perform multiplication. Semiconductor logic devices must remained powered on to retain the multiplication result, which consumes power.

A truth table for the inputs and outputs of a multiplier are shown in the table below:

| Input A[1:0] | Input B[1:0] | Multiplier Output M[3 2 1 0] |
|---|---|---|
| 00 | 00 | 0000 |
| 00 | 01 | 0000 |
| 00 | 10 | 0000 |
| 00 | 11 | 0000 |
| 01 | 00 | 0000 |
| 01 | 01 | 0001 |
| 01 | 10 | 0010 |
| 01 | 11 | 0011 |
| 10 | 00 | 0000 |
| 10 | 01 | 0010 |
| 10 | 10 | 0100 |
| 10 | 11 | 0110 |
| 11 | 00 | 0000 |
| 11 | 01 | 0011 |
| 11 | 10 | 0110 |
| 11 | 11 | 1001 |

A prior art device for ferromagnetic logic operations utilizes dipole magnetic field edge coupling of regions of ferromagnetic deposition onto a passive substrate. A dimensional limitation of nanoscale construction of these devices is that when the dipole coupled nanomagnets are scaled down to sub 50 nm, the reduction in associated energy barriers required to maintain magnetic state results in increased susceptibility towards soft errors whereby thermal noise causing perturbations of the ferromagnetic material can randomly flip the state of the nanomagnet and corrupt the information stored in it. Therefore, in order to successfully transfer information from one ferromagnetic dot to the other, the coupling energy between the nanomagnets should also exceed thermal noise. Although these devices work at low temperatures approaching 0° K, thermal noise interfering with the magnetic field orientation until the loss of magnetic properties associated with the material-specific Curie temperature is reached, and the device is no longer able to function. Additionally, when the dipole coupled nanomagnets are scaled down to sub 50 nm, the reduced size of the nanomagnets result in reduction of their energy barriers, which leads to increased susceptibility towards soft errors, where temperature fluctuations randomly flip the state of the nanomagnet and erase the stored information in it. Thus, in order to successfully transfer information from one dot to the other the coupling energy between the nanomagnets should be larger than thermal noise.

It is desired to provide an architecture and structures to perform arithmetic operations such as a two bit multiplication using ferromagnetic films, which operate reliably at room temperatures (25° C.) and above, and which retain the multiplication result in the absence of applied energy.

OBJECTS OF THE INVENTION

A first object of the invention is multiplier comprising an electrically conductive layer having a continuous surface of ferromagnetic material on one surface and a plurality of ferromagnetic regions on an opposite surface, the electrically conductive layer sufficiently thin to generate a ferromagnetic response, the plurality of ferromagnetic regions being arranged in a sparce rectangular array comprising at least five columns and 10 rows, the ferromagnetic regions further comprising an a0 input, an a1 input, a b0 input, and a b1 input, the ferromagnetic regions also including an m0 output, a plurality of m1 outputs, a plurality of m2 outputs, and a plurality of m3 outputs located on the second, third, and fourth columns of the sparse rectangular array.

SUMMARY OF THE INVENTION

An Interlayer Exchange Coupling (IEC) logic cell in a first example of the invention comprises a continuous bottom layer of ferromagnetic material, a layer of an extremely thin non-magnetic electrically conductive layer placed on the continuous layer of ferromagnetic material, and a plurality of regions of ferromagnetic material positioned on the extremely thin non-magnetic electrically conductive layer, the plurality of regions of ferromagnetic material formed on a top layer. The extremely thin non-magnetic electrically layer is sufficiently thin so as to generates the GMR effect and associated anti-ferromagnetic effect between top ferromagnetic layer regions and associated bottom ferromagnetic layer regions which form superposition magnetic fields in areas where not driven anti-ferromagnetic by the upper layer region.

A multiplier for [a1:a0] by [b1:b0] to generate an output [m3 m2 m1 m0] is formed with regions of ferromagnetic material on a first surface of a thin conductor such as copper, with a continuous layer of ferromagnetic material on a second surface opposite the first surface of the thin conductor. The regions of ferromagnetic material are arranged as a sparse rectangular array of ferromagnetic material regions in a first column, second column, third column, fourth column, and fifth column, the sparse rectangular array having a first row, second row, third row, fourth row, fifth row, sixth row, seventh row, eighth row, ninth row, and tenth row.

The first row has an a0 input ferromagnetic region at the second column.

The second row has a b0 input ferromagnetic region at the first column and an m0 output ferromagnetic region at the second column.

The third row has a zero ferromagnetic region in the second and fourth columns and a one ferromagnetic region in the third column.

The fourth row has a b0 input ferromagnetic region at the first column, m1 output ferromagnetic regions at the second column, third column, and fourth column, and a b1 input ferromagnetic region at the fifth column.

The fifth row has an a1 input ferromagnetic region at the second column, a zero ferromagnetic region at the third column, and an a0 input ferromagnetic region at the fourth column.

The sixth row has a b1 input ferromagnetic region at the first column, an m3 output ferromagnetic region at the second column, third column, fourth column, and a b0 input ferromagnetic region at the fifth column.

The seventh row has a zero ferromagnetic region at the second and fourth columns, and an m3 output region at the third column.

The eighth row has an a1 input ferromagnetic region at the second column and an m3 output ferromagnetic region at the third column.

The ninth row has a b1 input ferromagnetic region at the first column, an m2 output ferromagnetic region at the second and third columns, and a one ferromagnetic region at the fourth column.

The tenth row has a zero ferromagnetic region at the second column.

The a0, a1, b0, and b1 inputs are provided with a "1" magnetic field input with a magnetic field applied in a first direction parallel to the columns, and a "0" magnetic field with a magnetic field applied in a second direction opposite from the first direction. The one ferromagnetic regions have a magnetic field applied in the first direction and the zero ferromagnetic regions have a magnetic field applied in the second direction.

The m3, m2, m1, and m0 outputs are magnetic fields which are sensed as "1" in the first direction and "0" in the second direction.

DETAILED DESCRIPTION OF THE INVENTION

As described in the background of the invention, it is desired to provide a nanomagnetic two input multiplier device which operates at higher temperatures than the prior art. The Interlayer Exchange Coupled (IEC) topology of the present invention has been shown to offer stronger interaction between thin ferromagnetic layers, resulting in greater scalability and better data retention at the deep sub-micron level, hence allowing magnetic interaction to be manipulated both in the vertical and lateral directions at the same time. According to known scientific approximations, a nominal value indicates as "on the order of" a nominal value is understood to be on the order of magnitude of the nominal value, or in the range one-tenth of the nominal value to ten times the nominal value. A value which is "approximately" a nominal value is understood to be +/−50% of the nominal value.

In the present disclosure, by convention, the example logic term a1, a0, b1, and b0 are binary magnetization values. The binary magnetization values of '1' and '0' will have magnetization values in generally opposing directions taken as a whole over the associated ferromagnetic regions. For simplicity in understanding the invention, a "1" value is understood as a magnetic vector where the majority of magnetic flux is oriented in an opposite direction from a "0" value, in the present examples, a "1" value has magnetic flux directed upwards on the sheet (along the long axis of the multiplier structure), and a "0" value is understood as a magnetic vector where the majority of magnetic flux is oriented in the opposite direction of the "1" value.

Figure 1A:
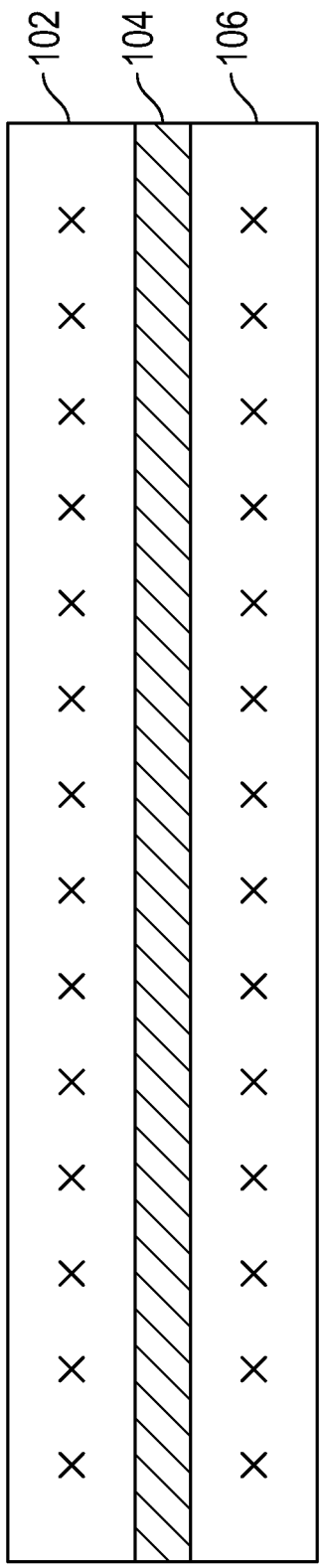
FIG. 1A is a cross section of ferromagnetic material layers separated by a non-magnetic layer of thickness sufficient to invoke a ferromagnetic response.
Figure 1B:
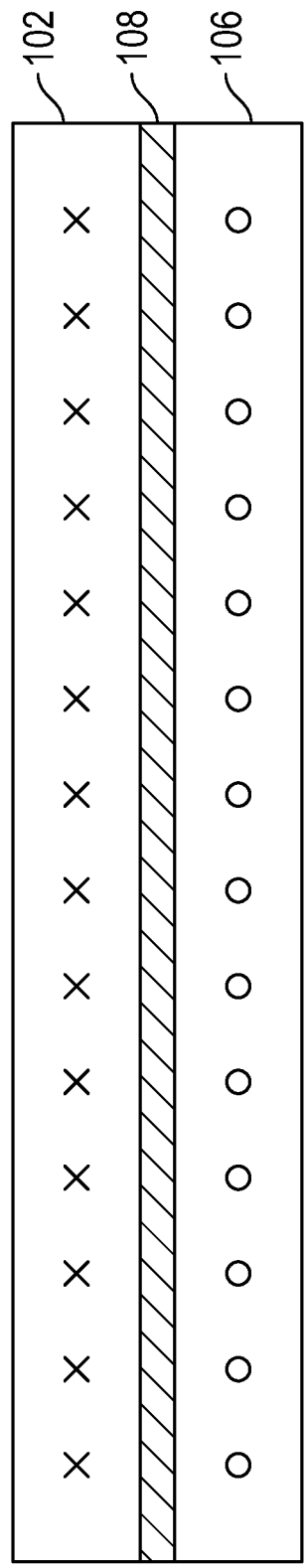
FIG. 1B is a cross section as in FIG. 1A with a thin non-magnetic layer of thickness sufficient to invoke an anti-ferromagnetic response.
Figure 2A:
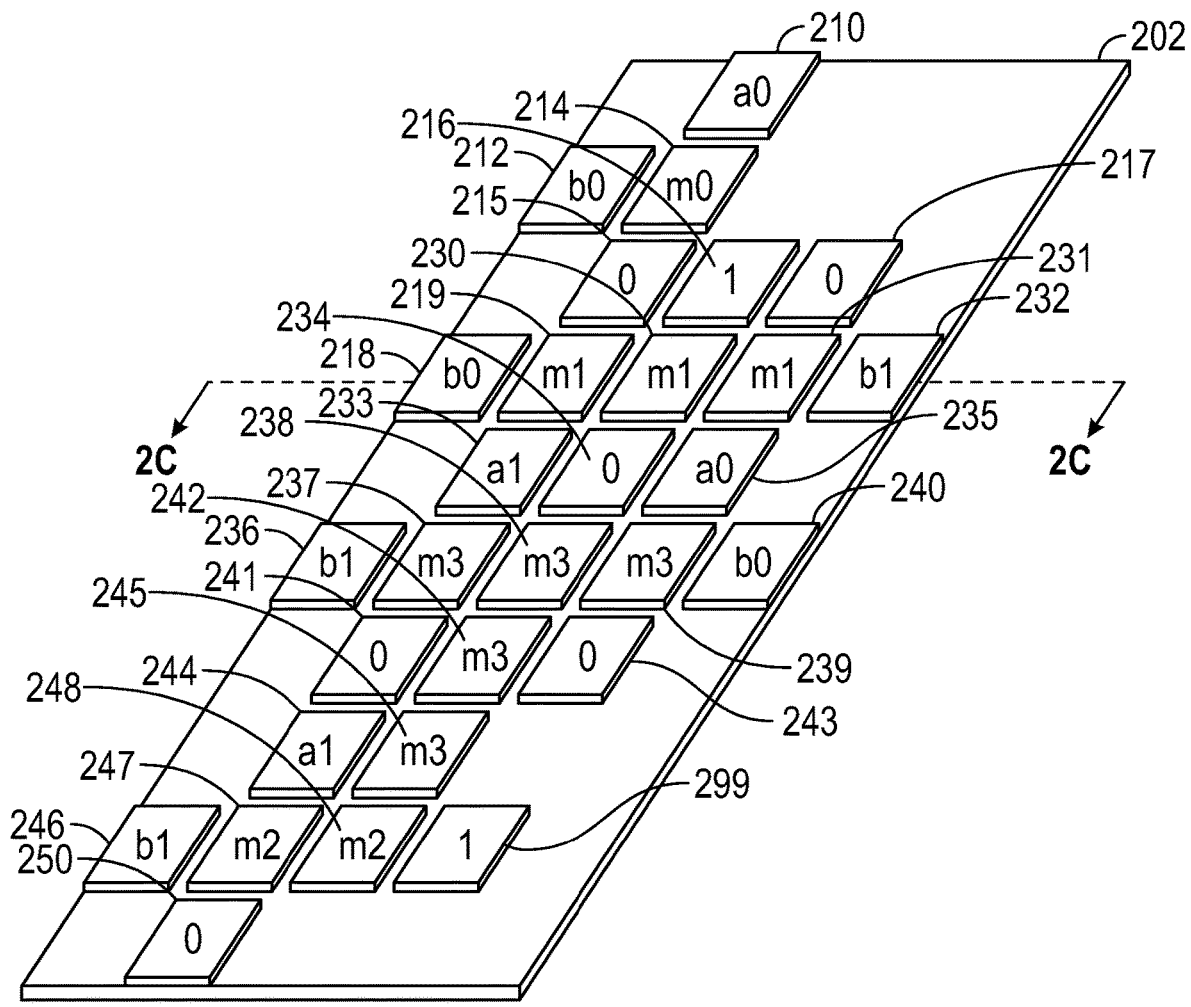
FIG. 2A is a perspective view of a three bit multiplier according to an example of the invention.
Figure 2B:
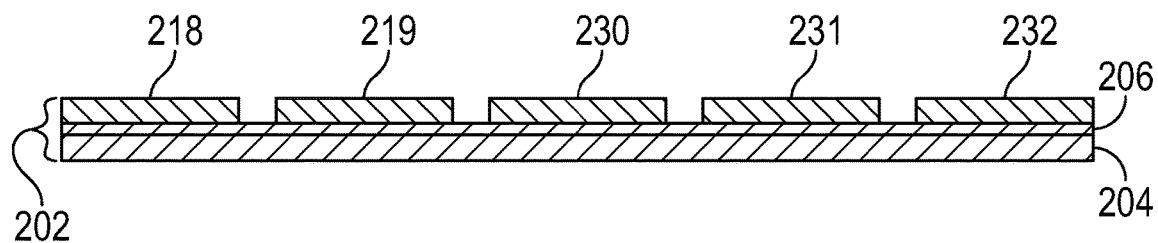
FIG. 2B is a cross section view of section C-C of FIG. 2A.
Figures 3A, 3B:
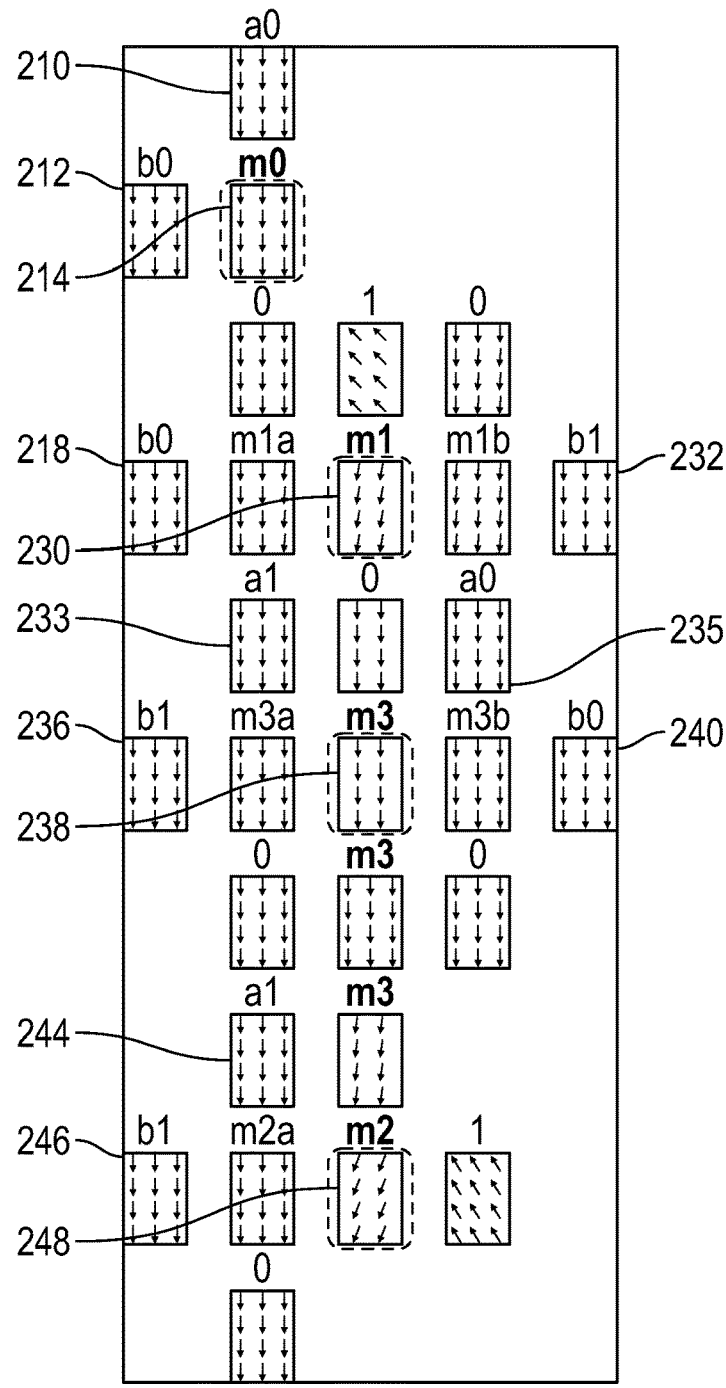
FIGS. 3A, 4A, 5A, 6A, 7A, 8A, 9A, 10A, 11A, 12A, 13A, 14A, 15A, 16A, 17A, and 18A show a truth table for the multiplier indicating the magnetization states of the various input regions and output regions.
FIGS. 3B, 4B, 5B, 6B, 7B, 8B, 9B, 10B, 11B, 12B, 13B, 14B, 15B, 16B, 17B, and 18B show top layer region magnetizations for the associated truth tables 3A, 4A, 5A, 6A, 7A, 8A, 9A, 10A, 11A, 12A, 13A, 14A, 15A, 16A, 17A, and 18A, respectively.
Figure 3C:
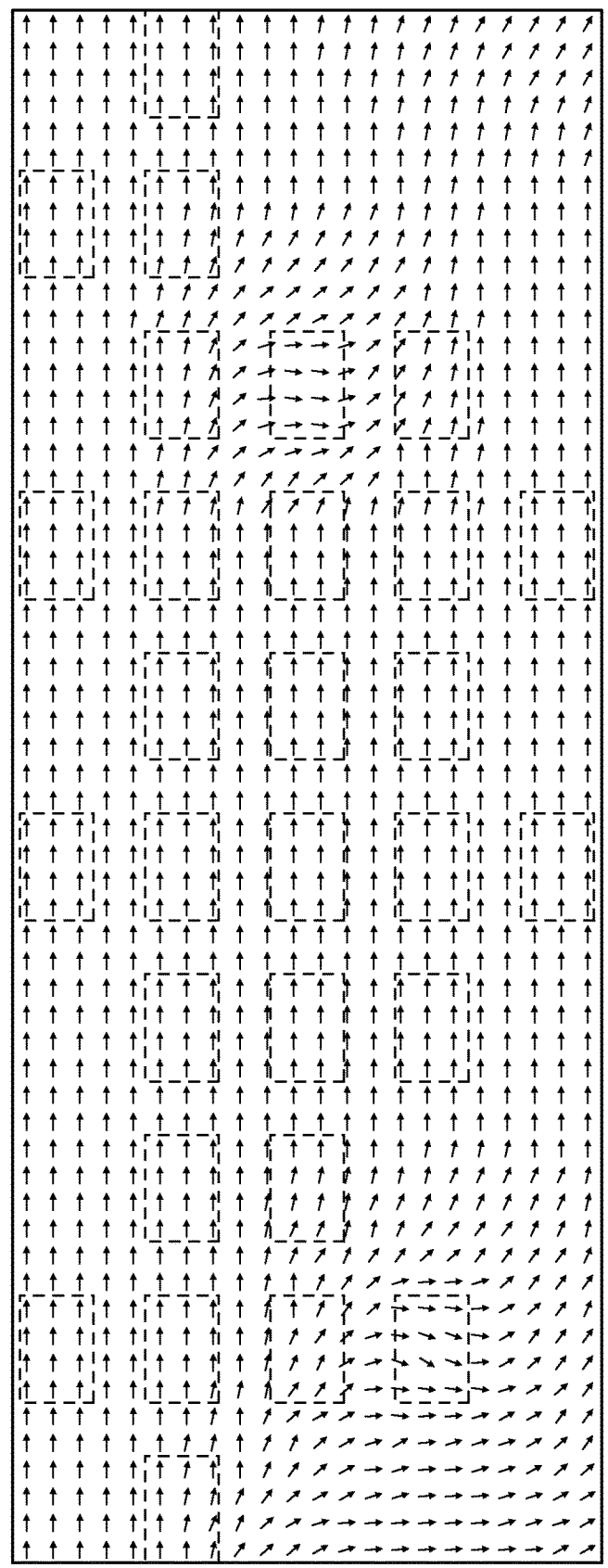
FIGS. 3C, 4C, 5C, 6C, 7C, 8C, 9C, 10C, 11C, 12C, 13C, 14C, 15C, 16C, 17C, and 18C show bottom layer magnetizations and superpositions for the associated truth tables of FIGS. 3B, 4B, 5B, 6B, 7B, 8B, 9B, 10B, 11B, 12B, 13B, 14B, 15B, 16B, 17B, and 18B, respectively.
Figures 4A, 4B:
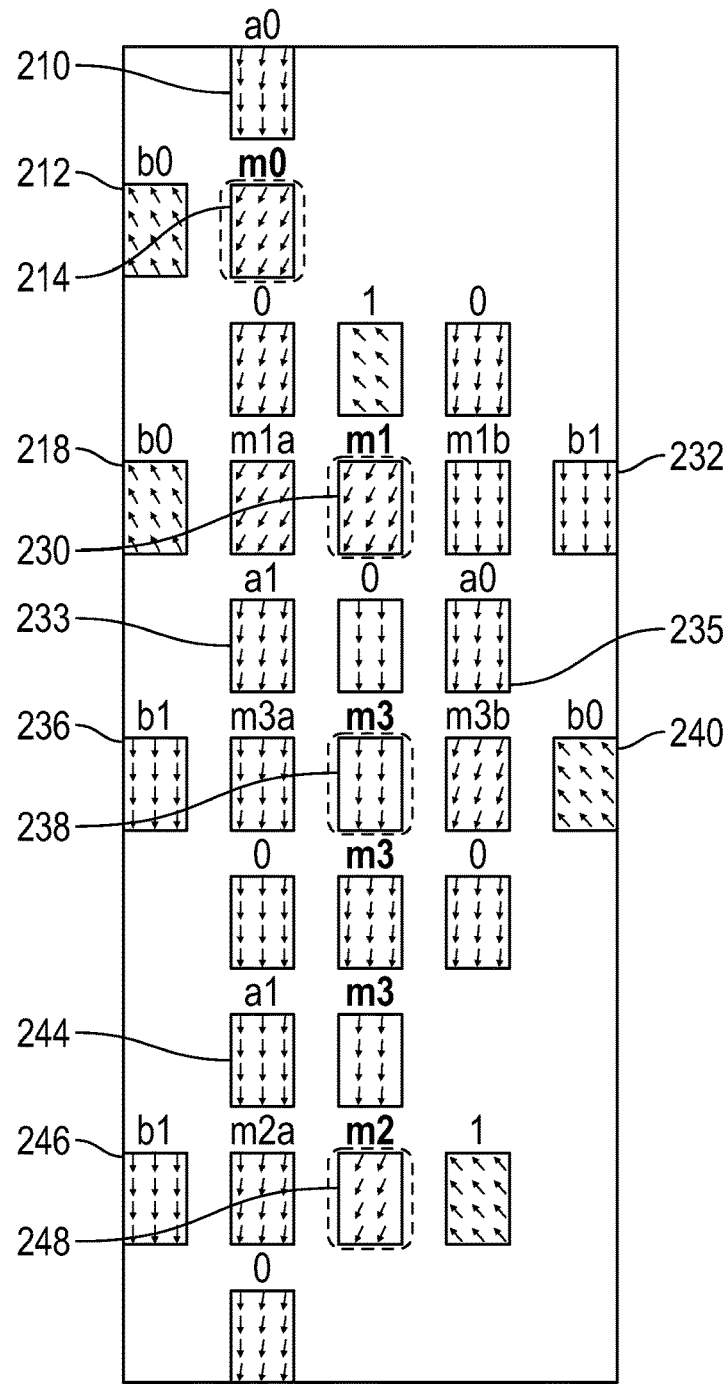
Figure 4C:
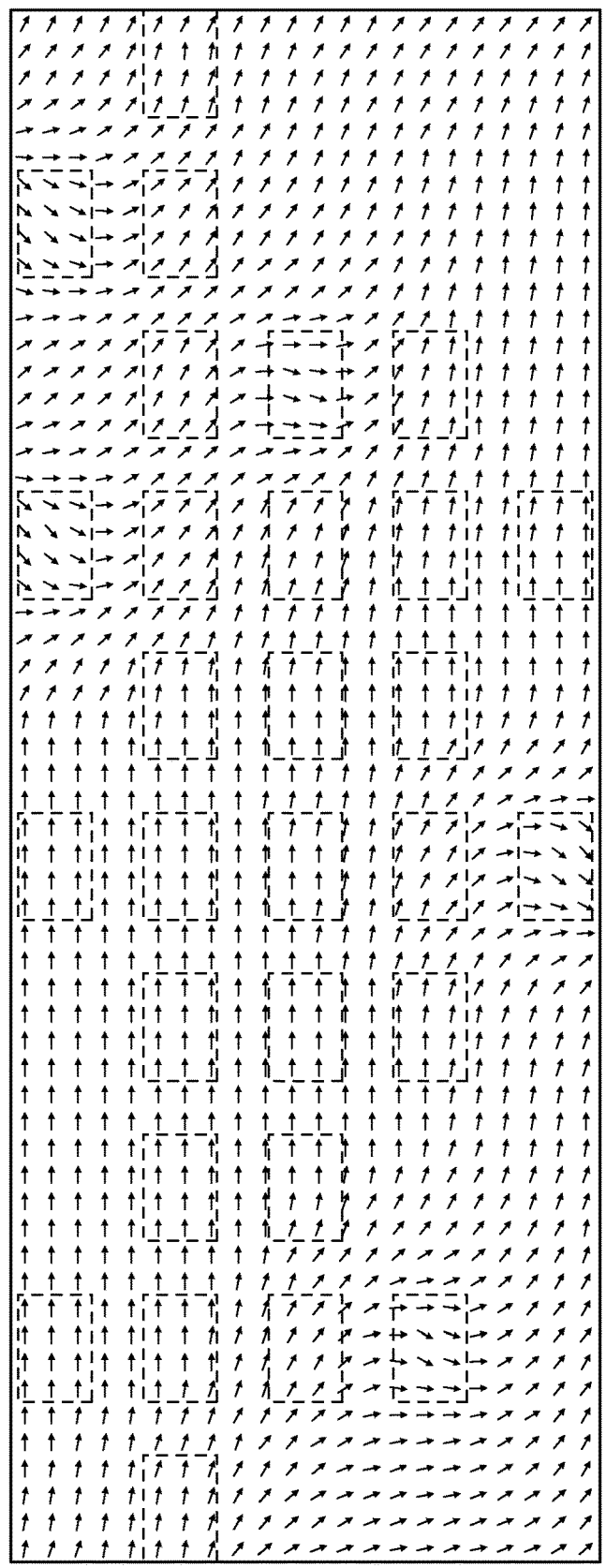
Figures 5A, 5B:
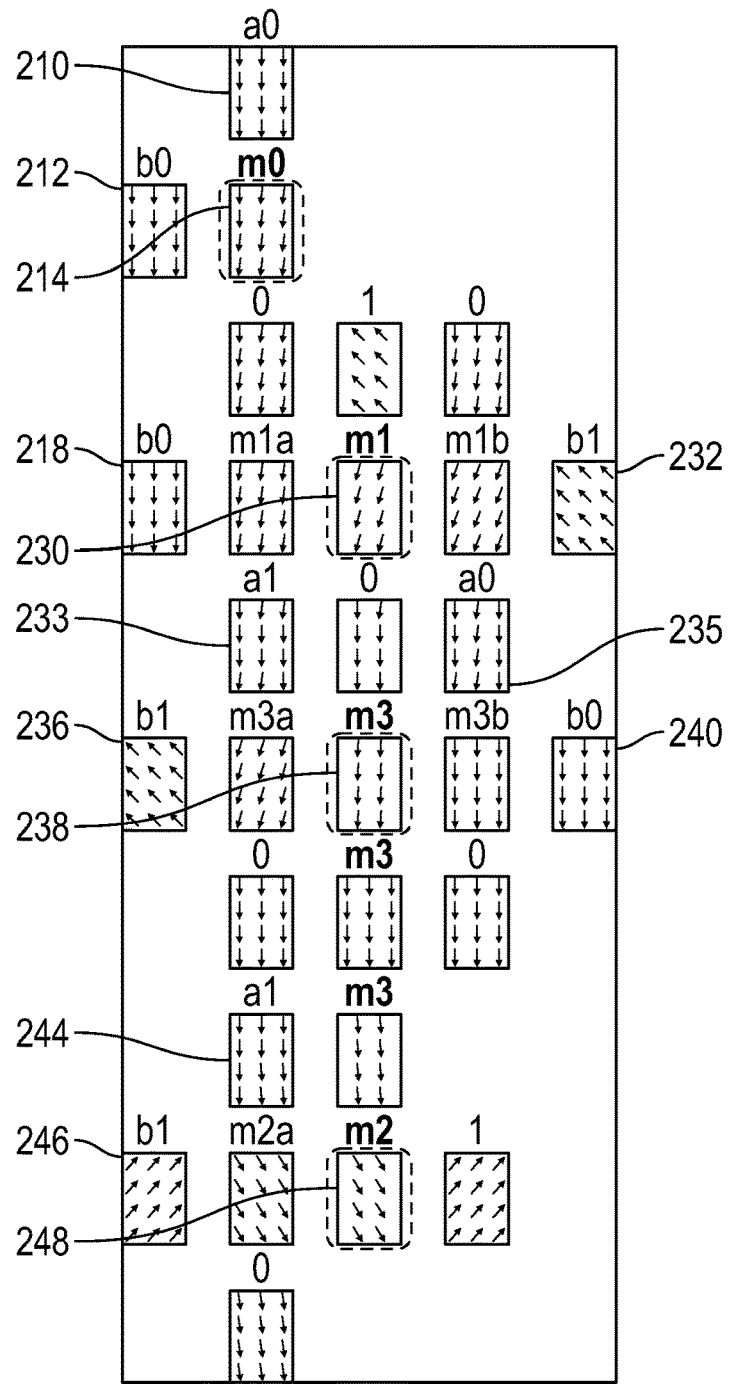
Figure 5C:
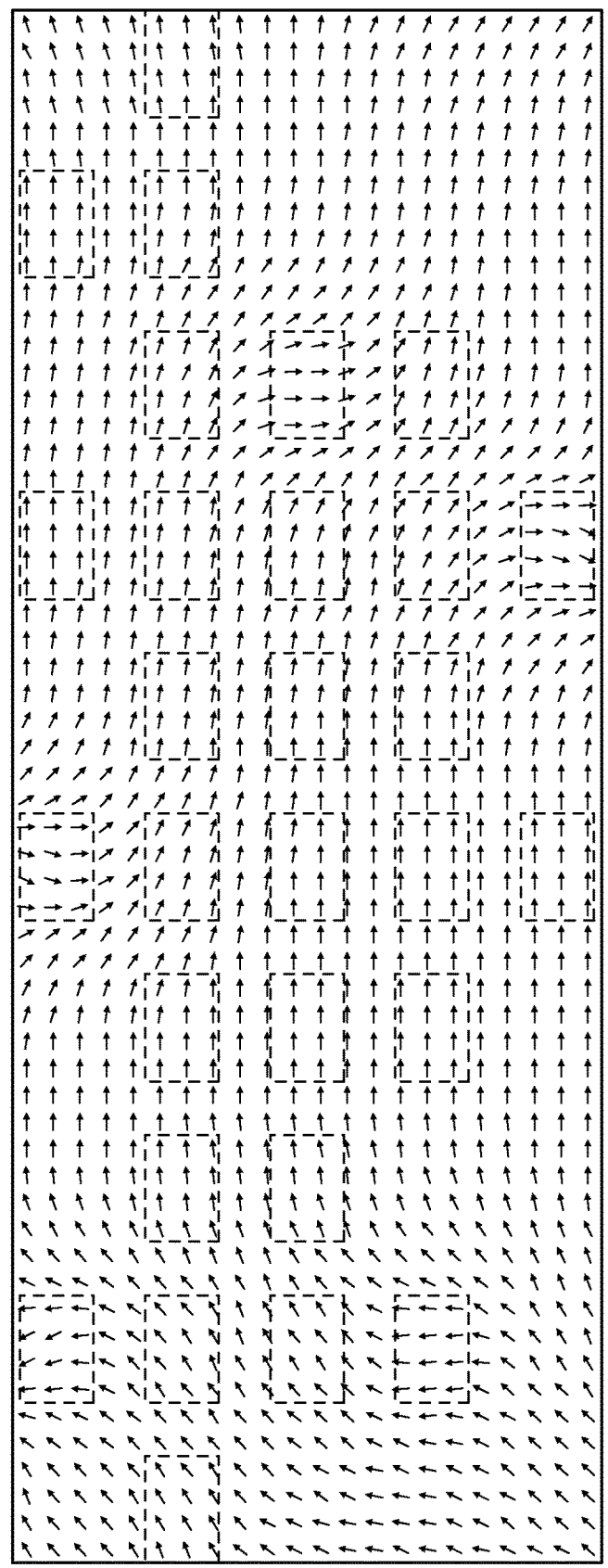
Figures 6A, 6B:
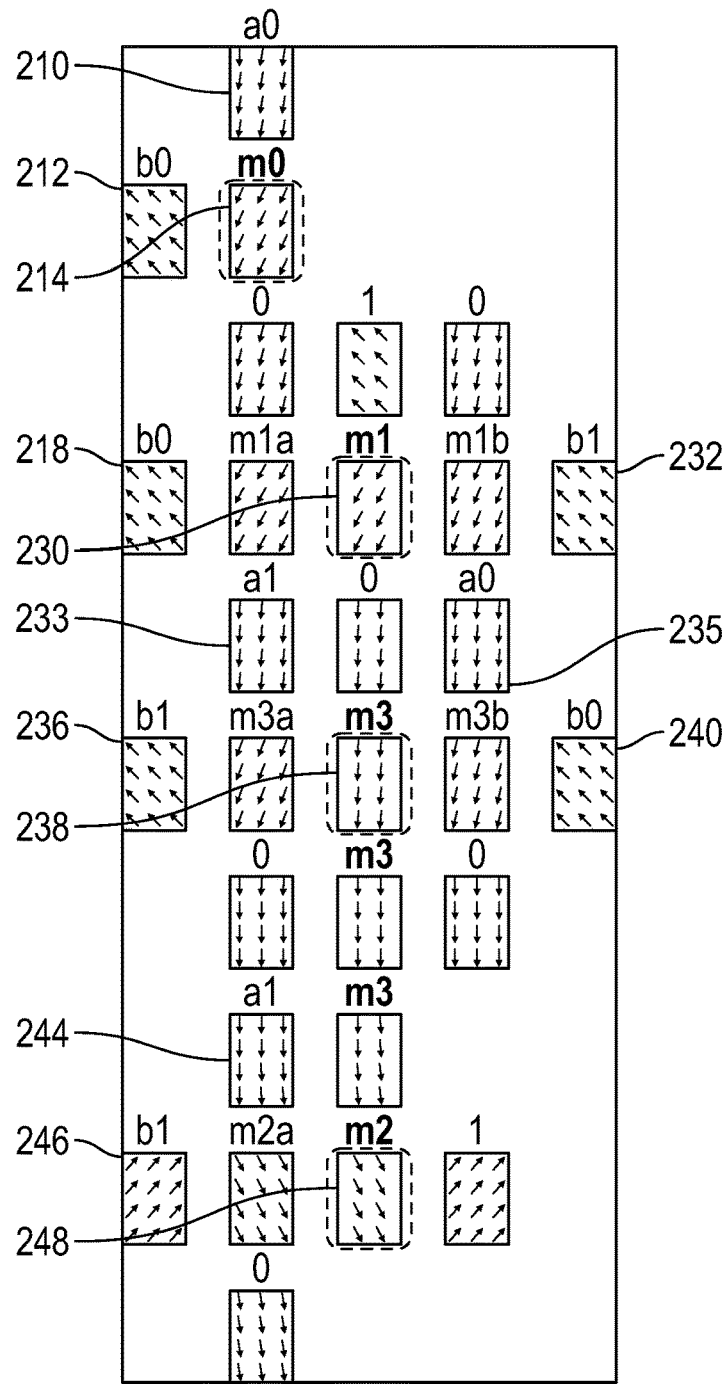
Figure 6C:
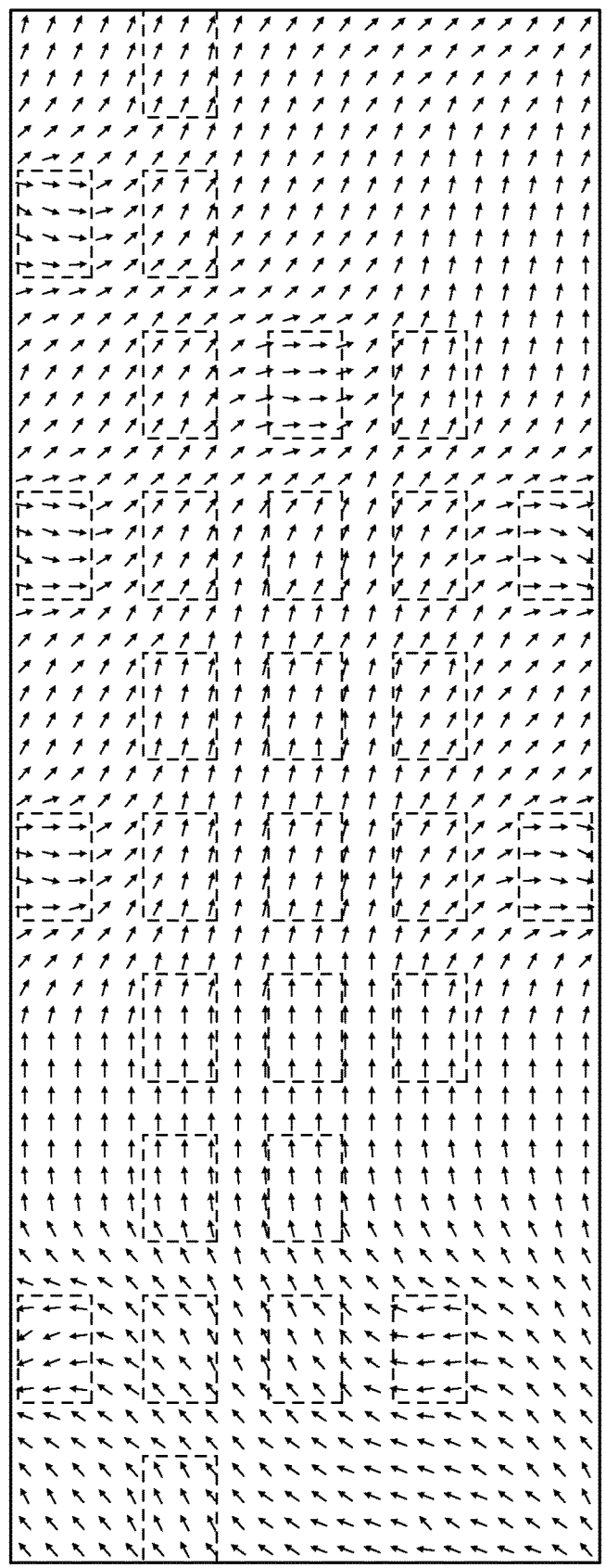
Figures 7A, 7B:
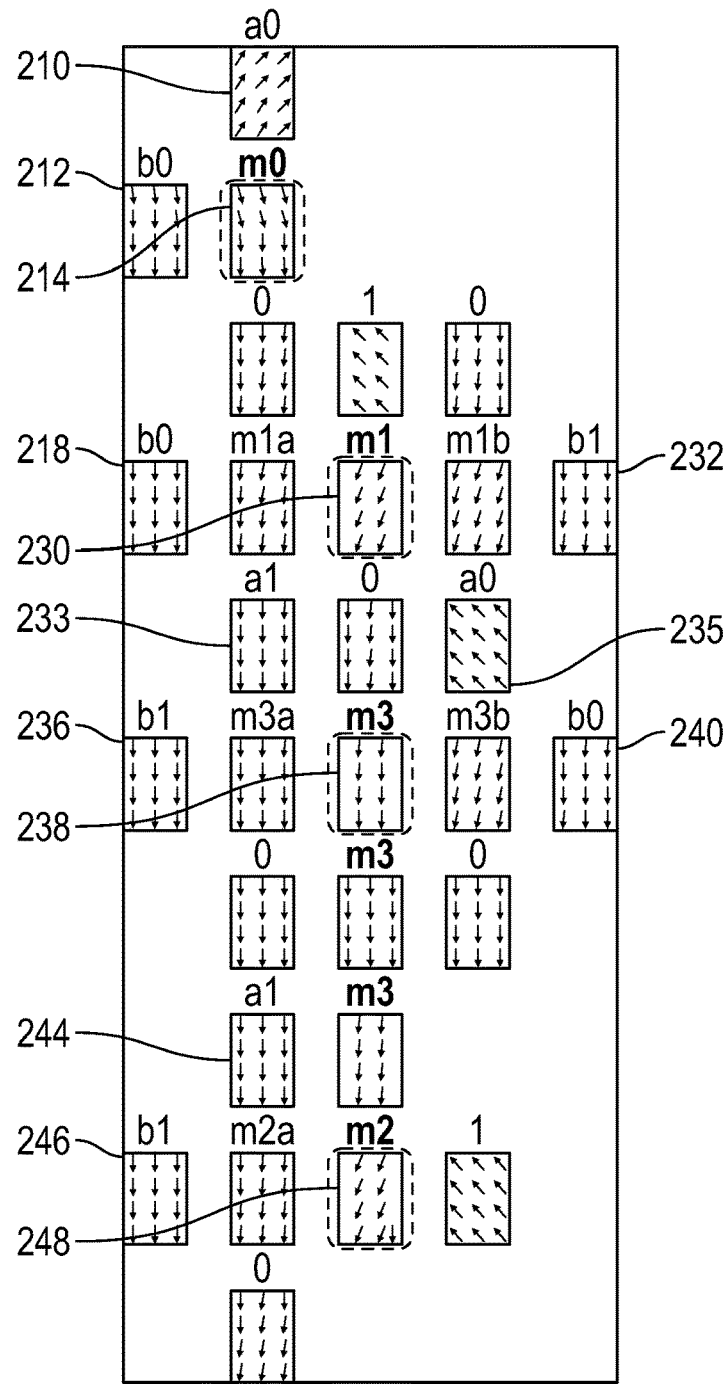
Figure 7C:
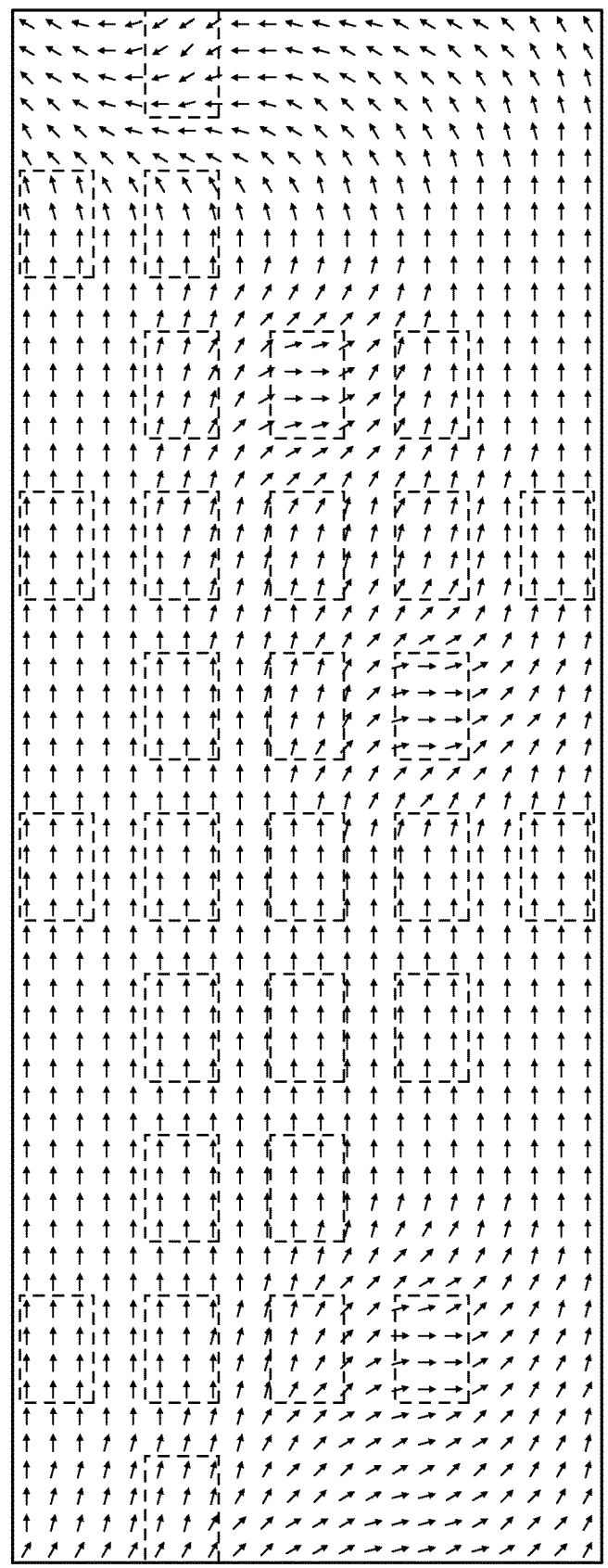
Figures 8A, 8B:
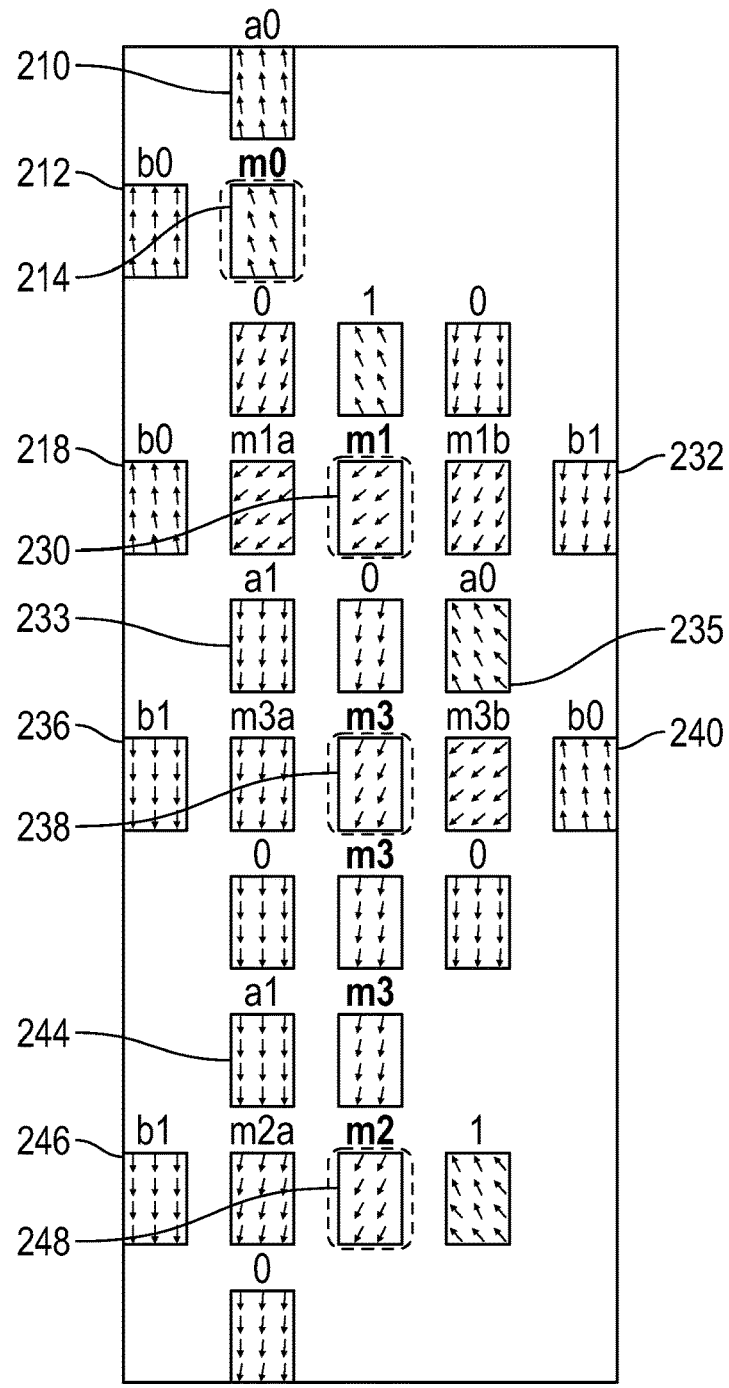
Figure 8C:
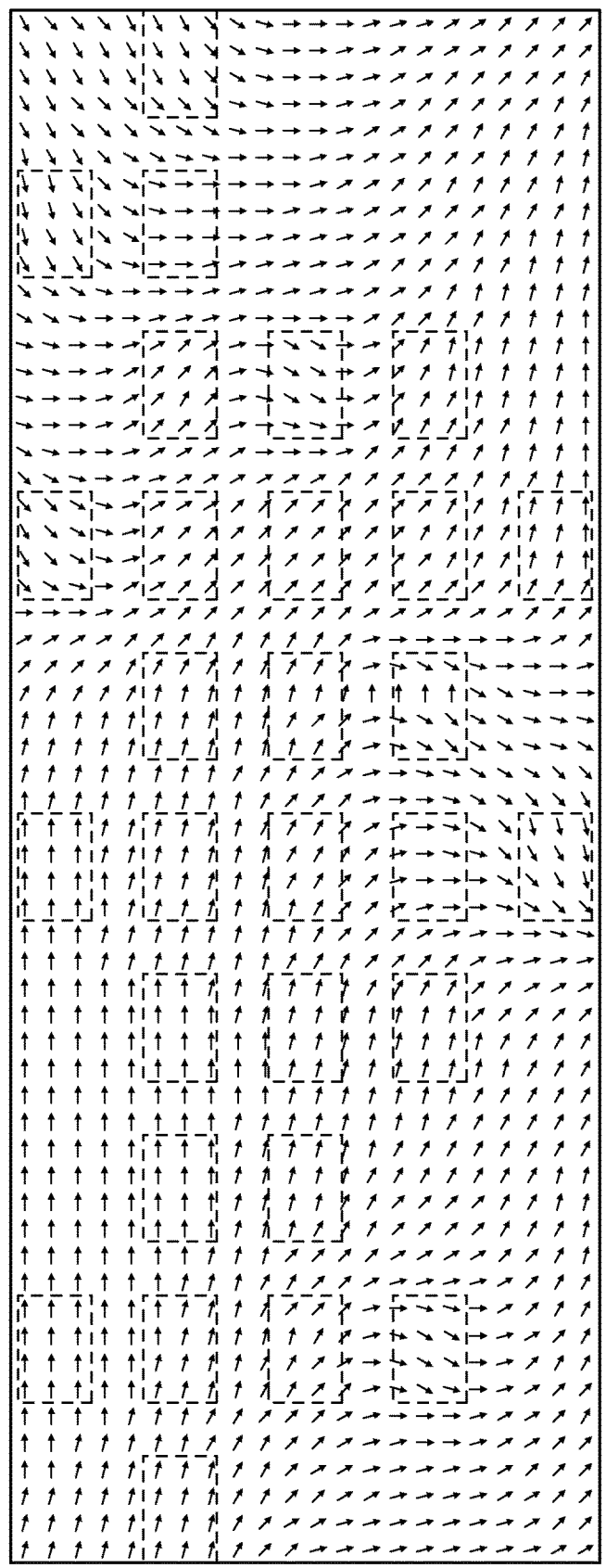
Figures 9A, 9B:
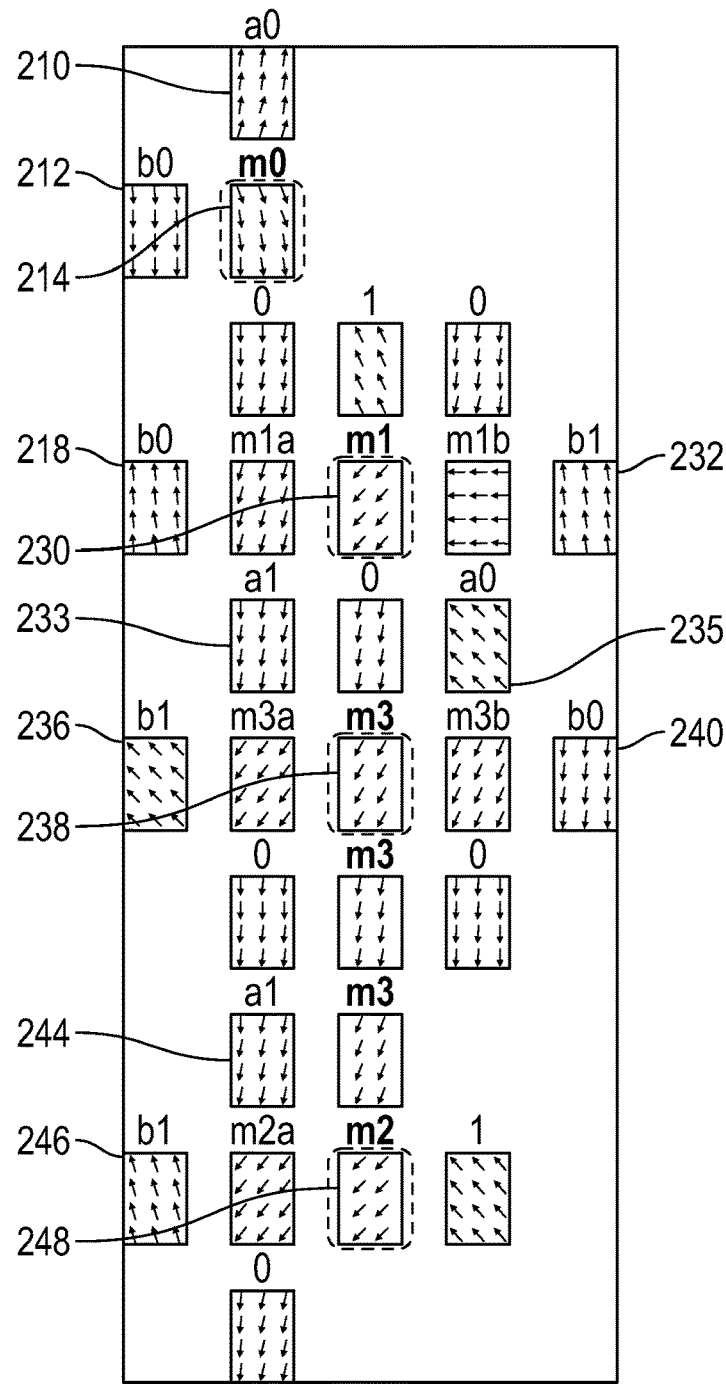
Figure 9C:
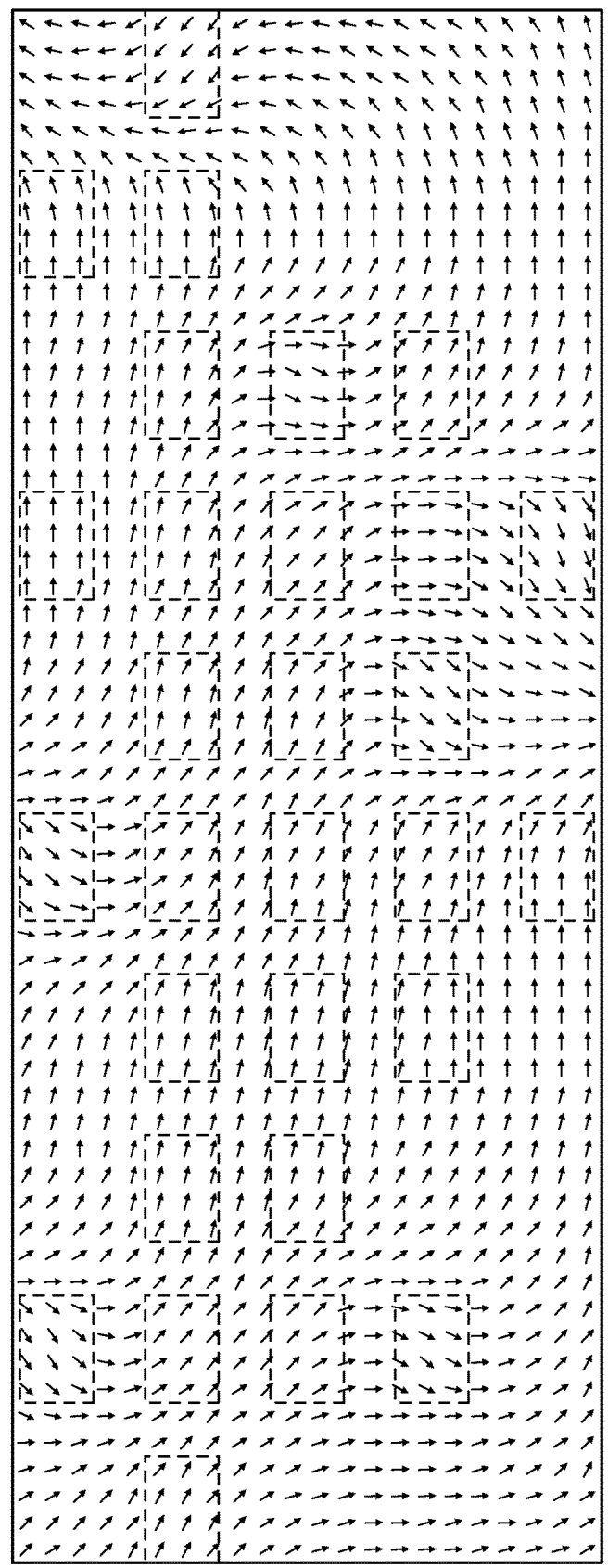
Figures 10A, 10B:
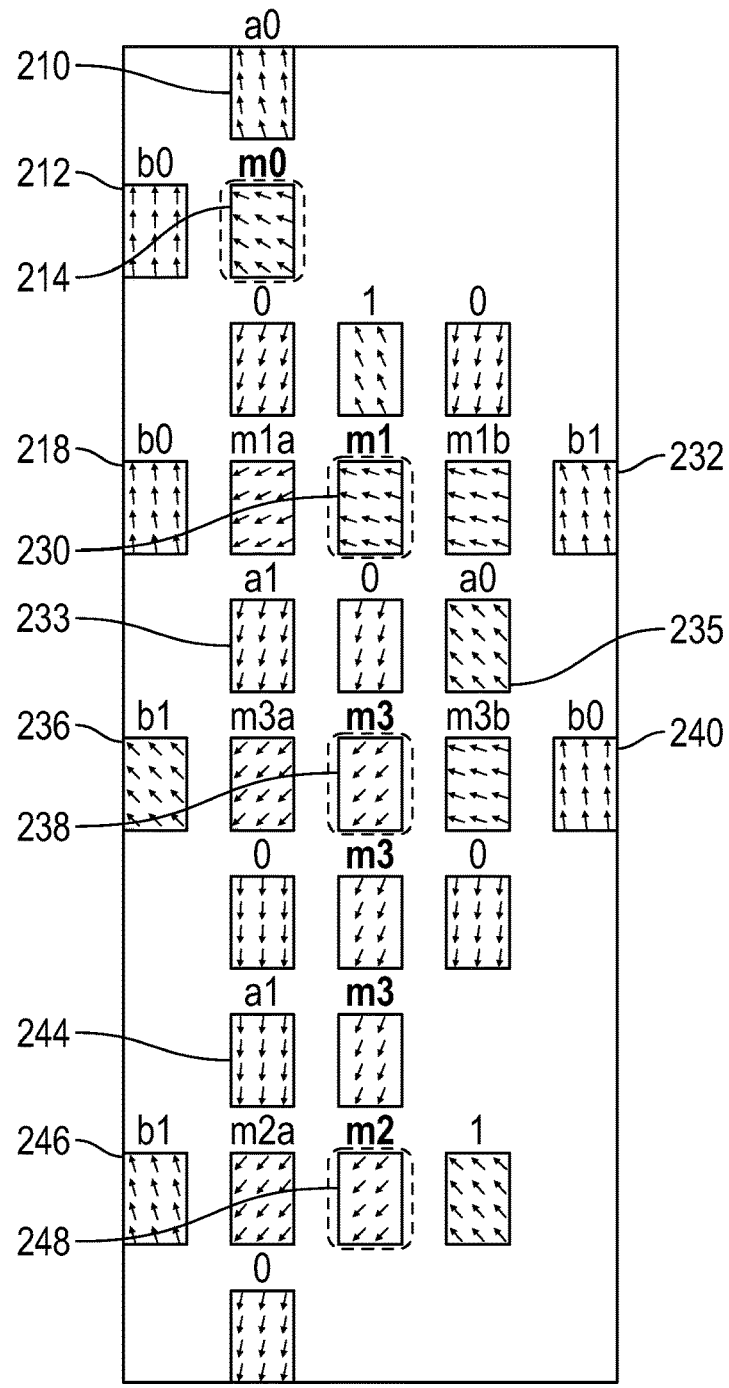
Figure 10C:
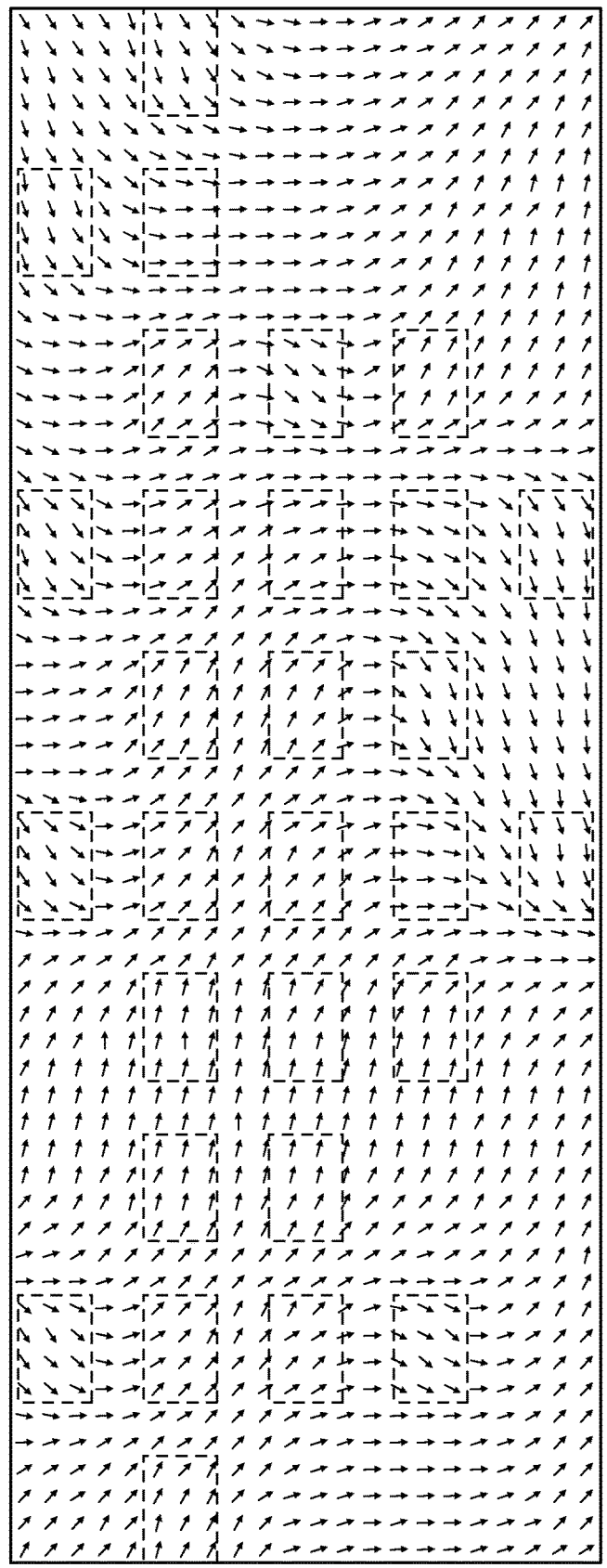
Figures 11A, 11B:
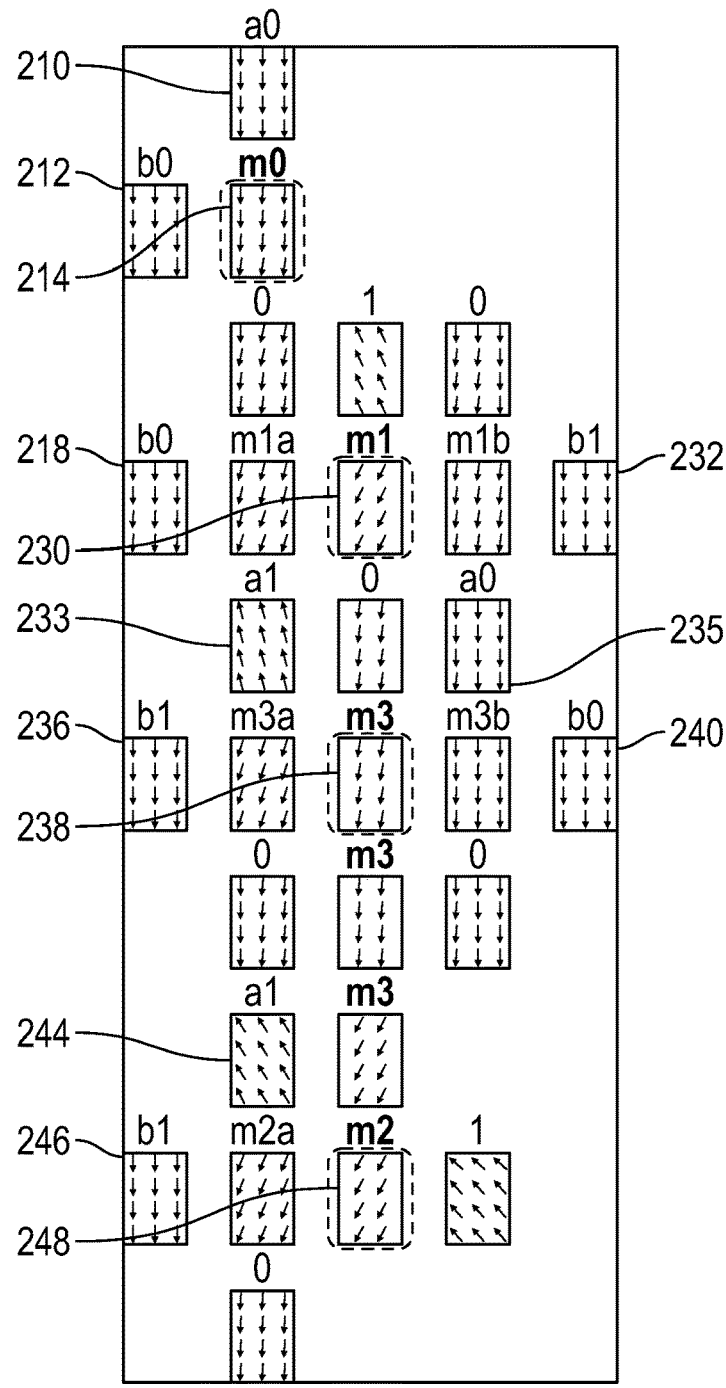
Figure 11C:
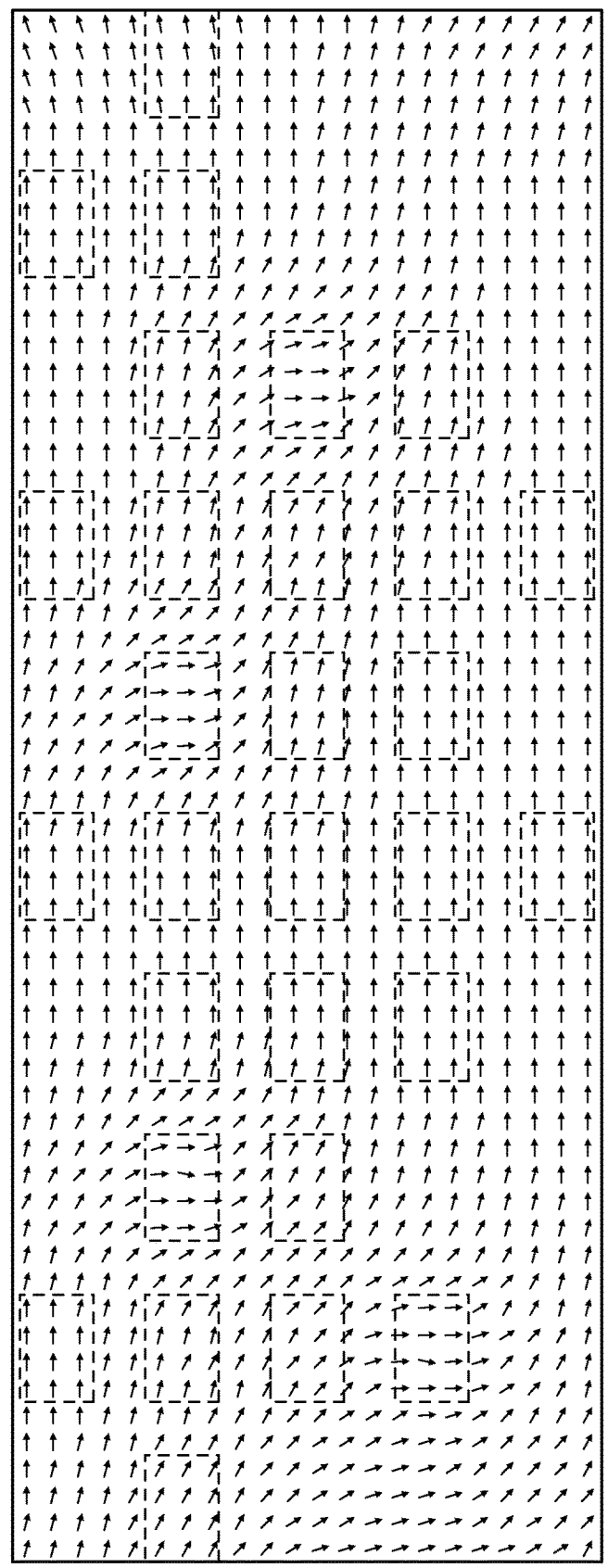
Figures 12A, 12B:
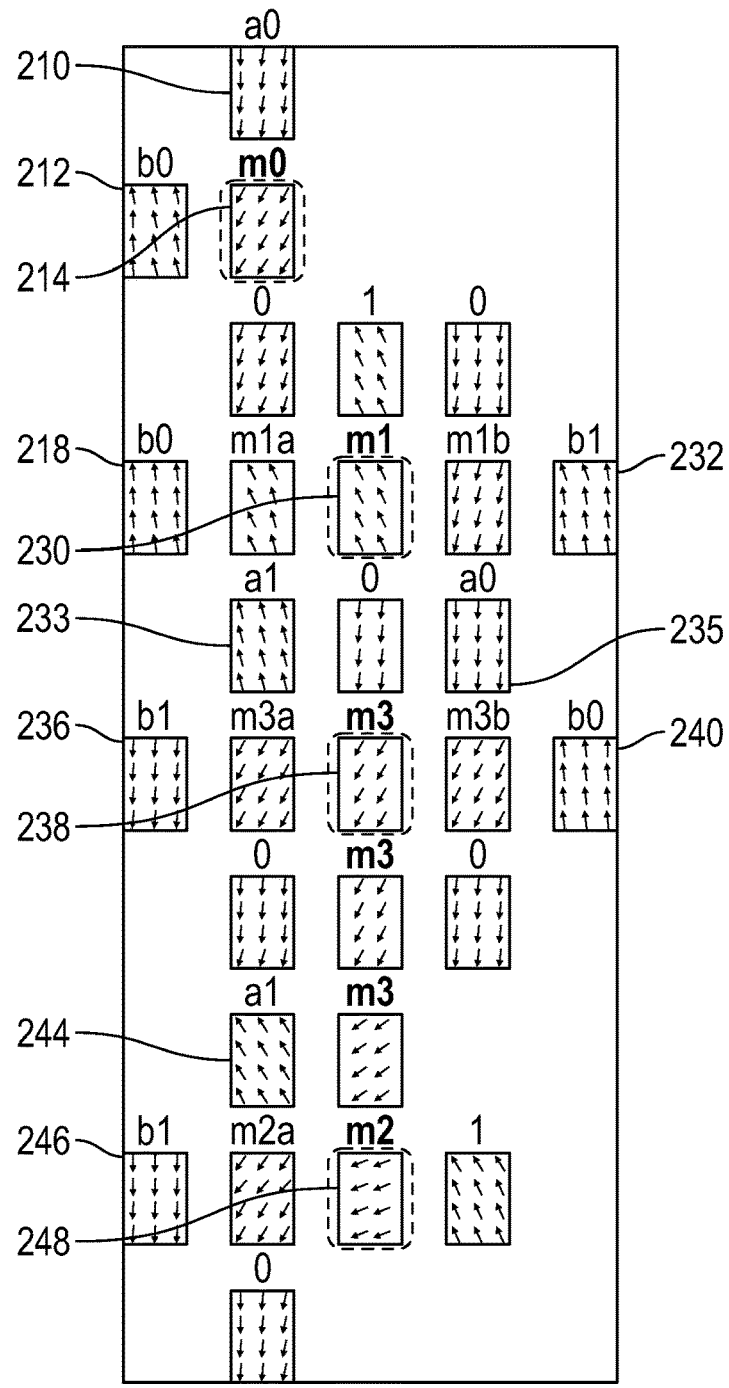
Figure 12C:
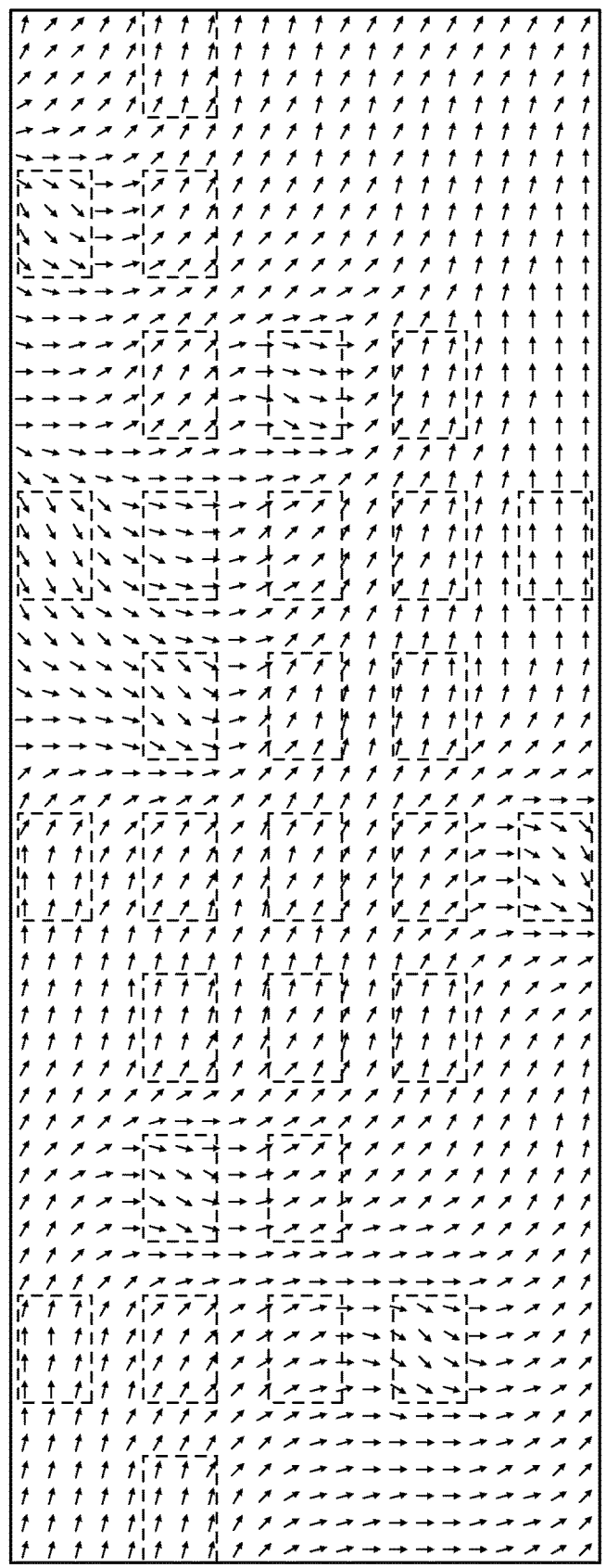
Figures 13A, 13B:
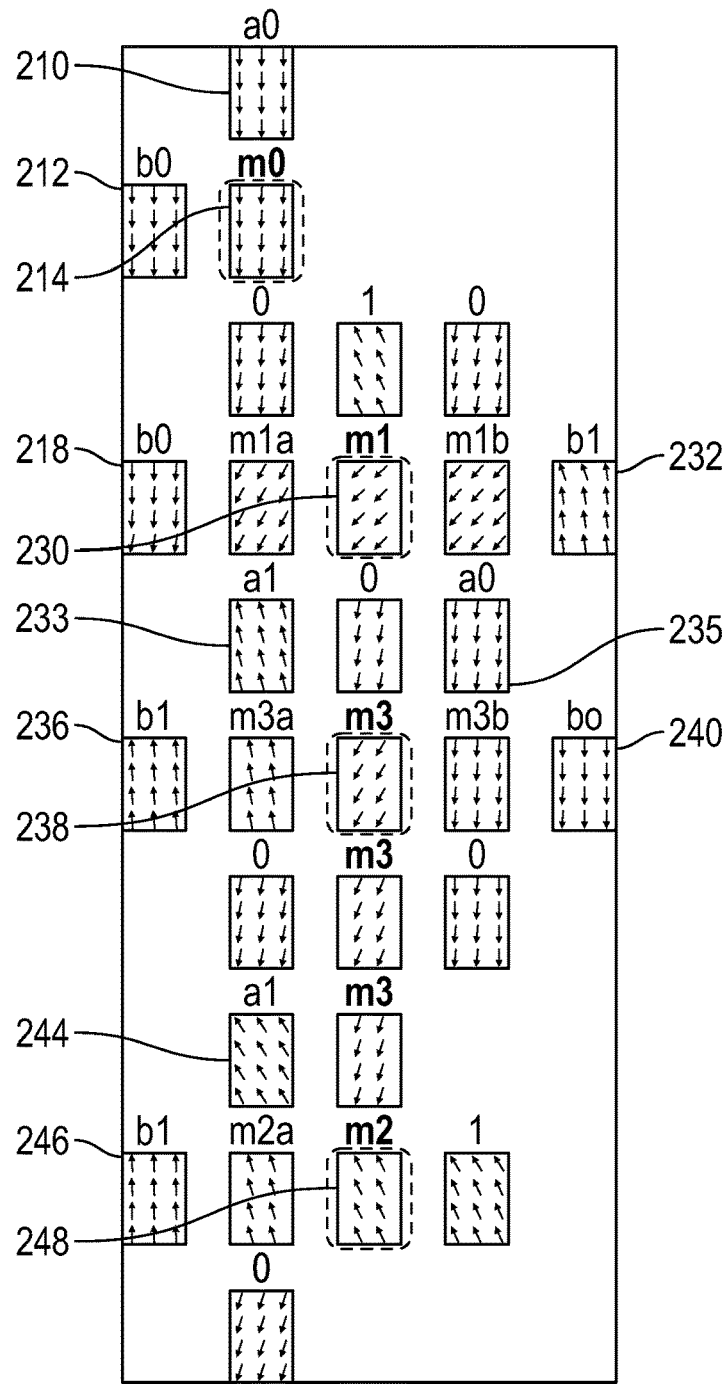
Figure 13C:
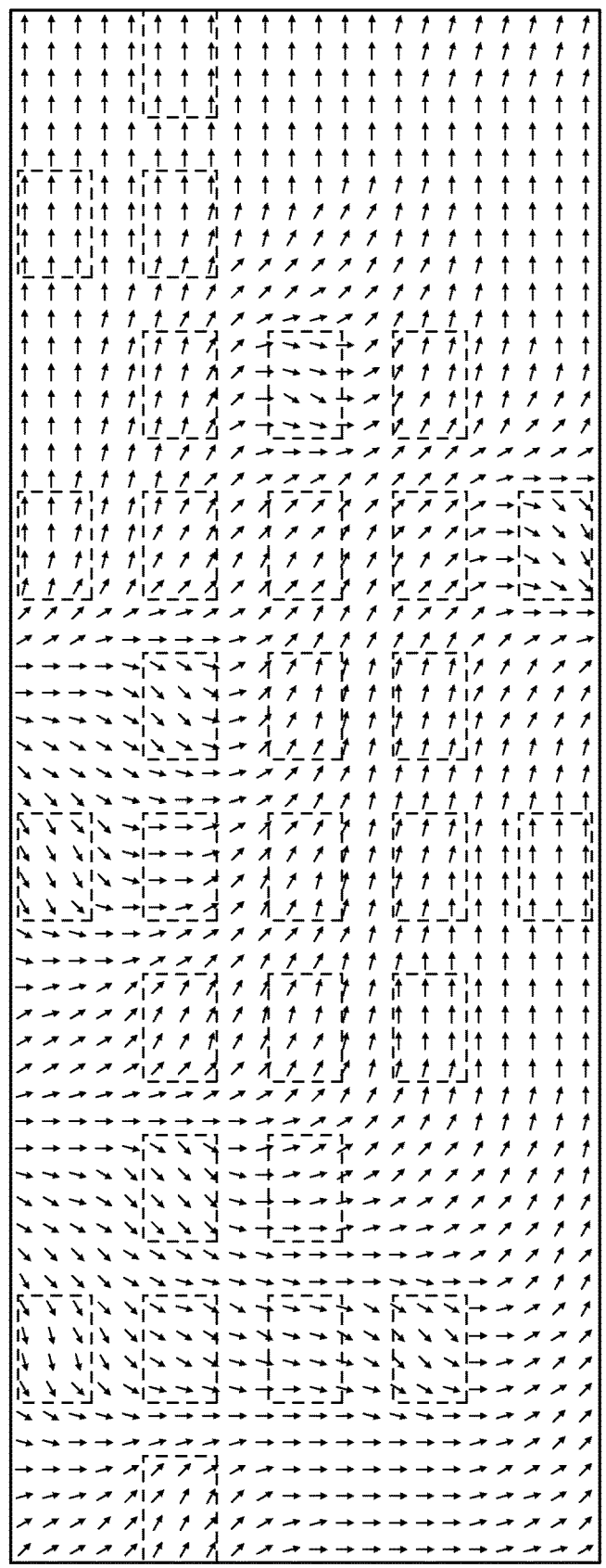
Figures 14A, 14B:
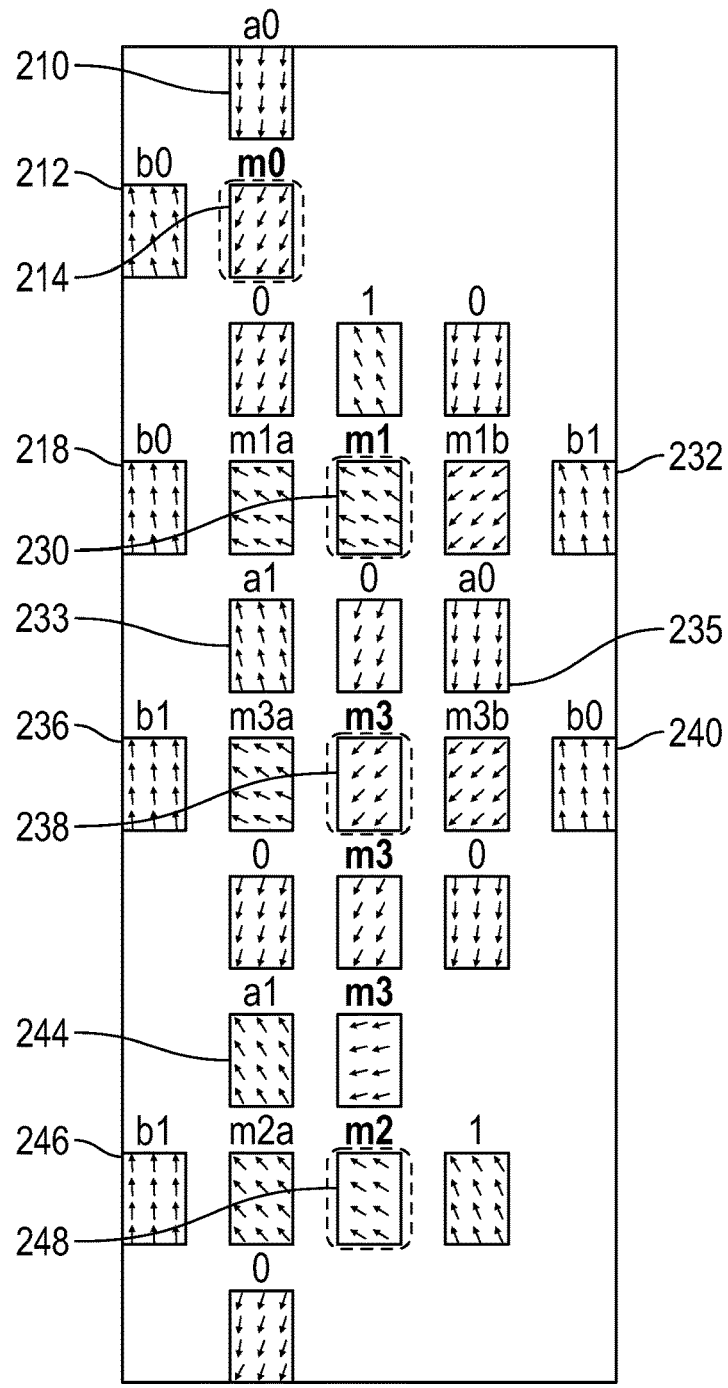
Figure 14C:
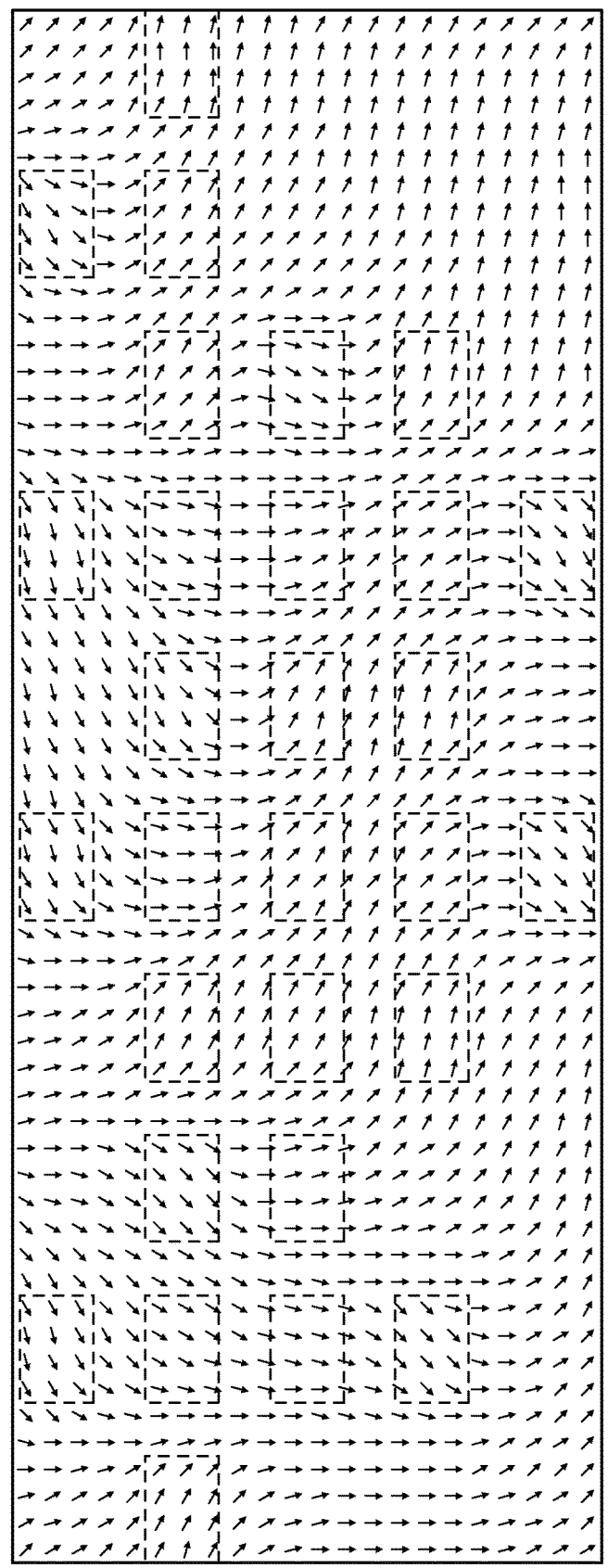
Figures 15A, 15B:
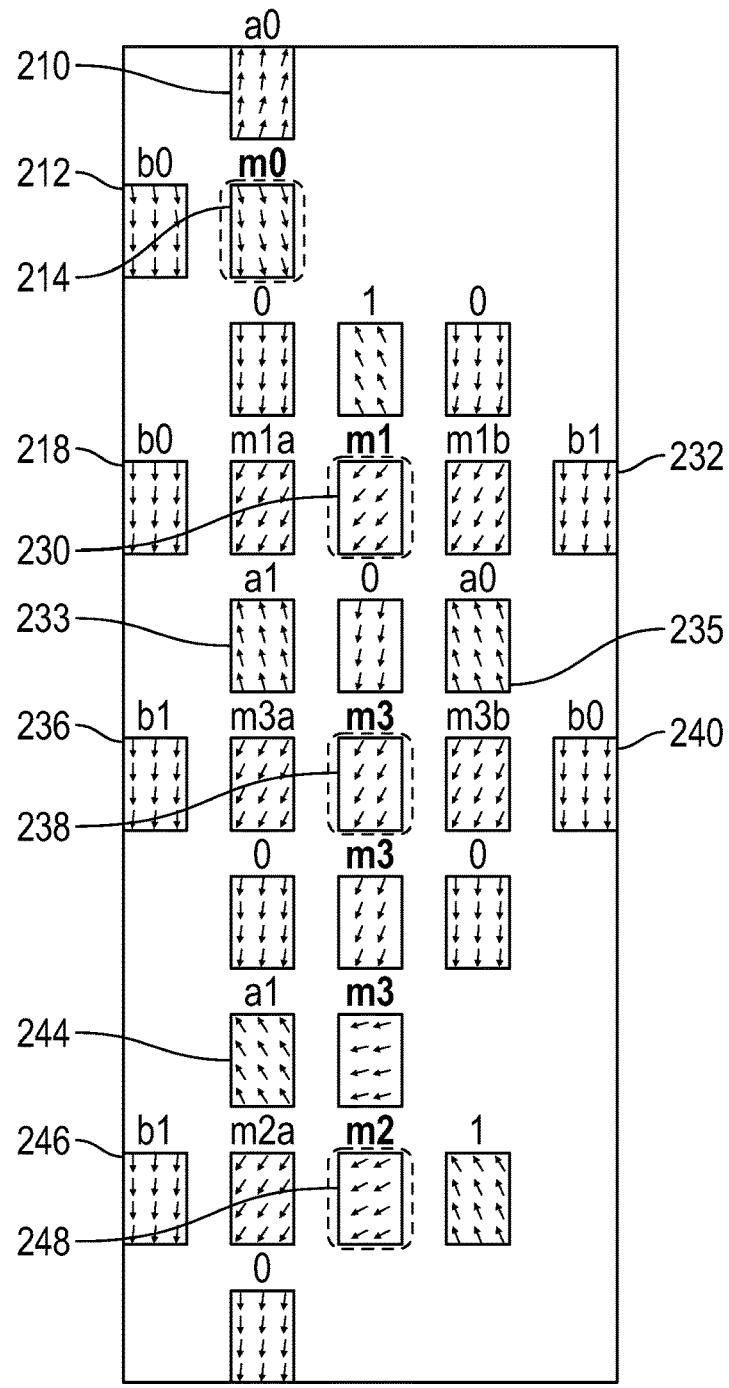
Figure 15C:
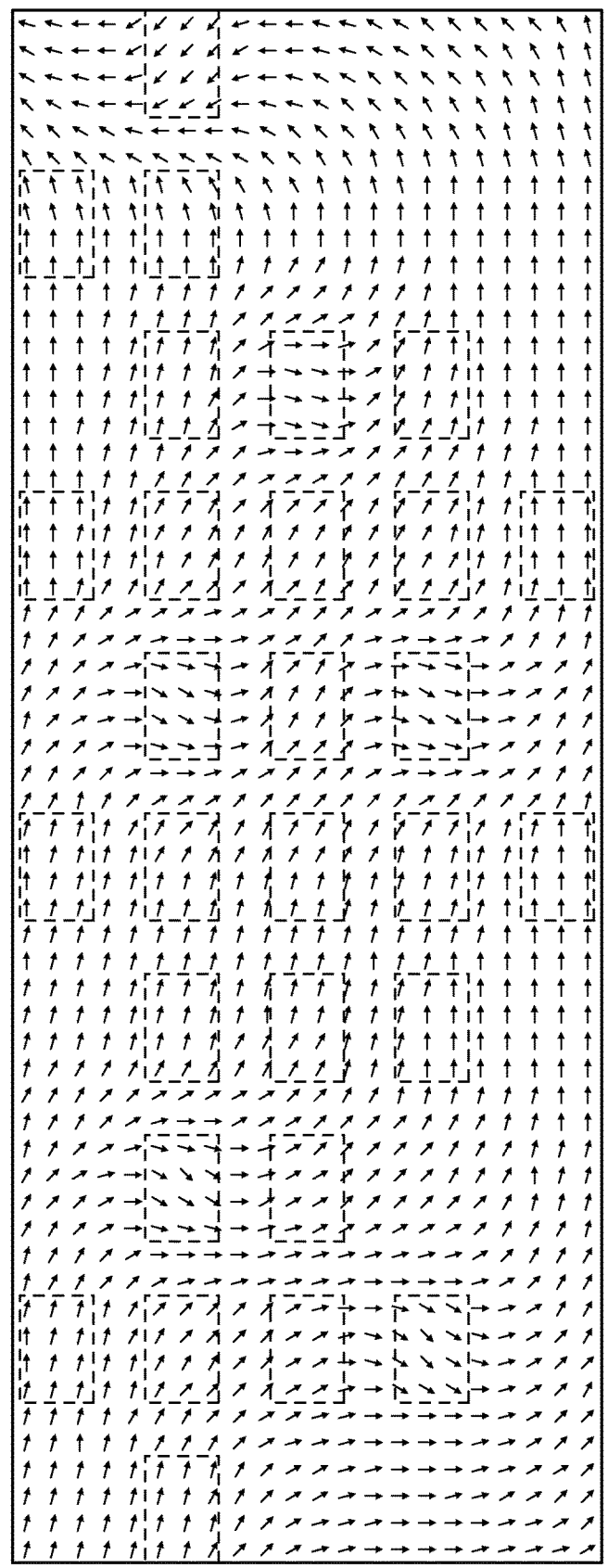
Figures 16A, 16B:
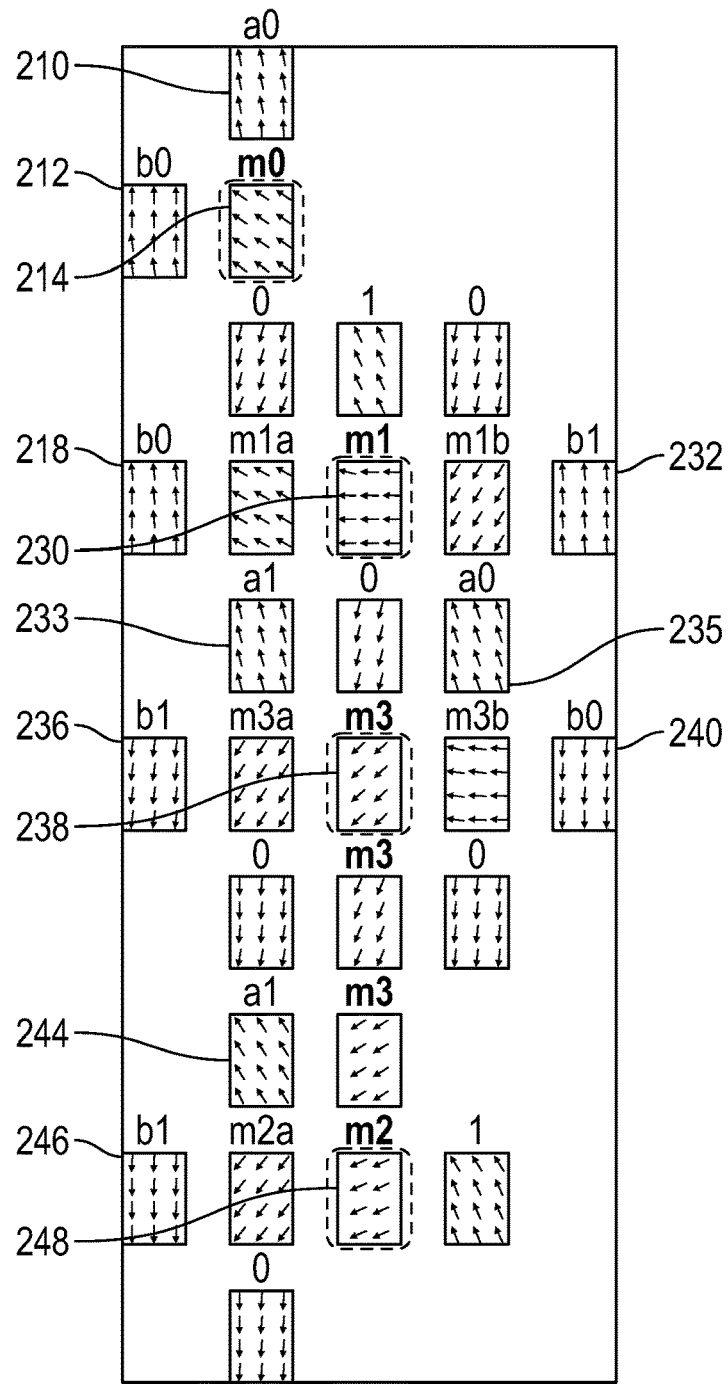
Figure 16C:
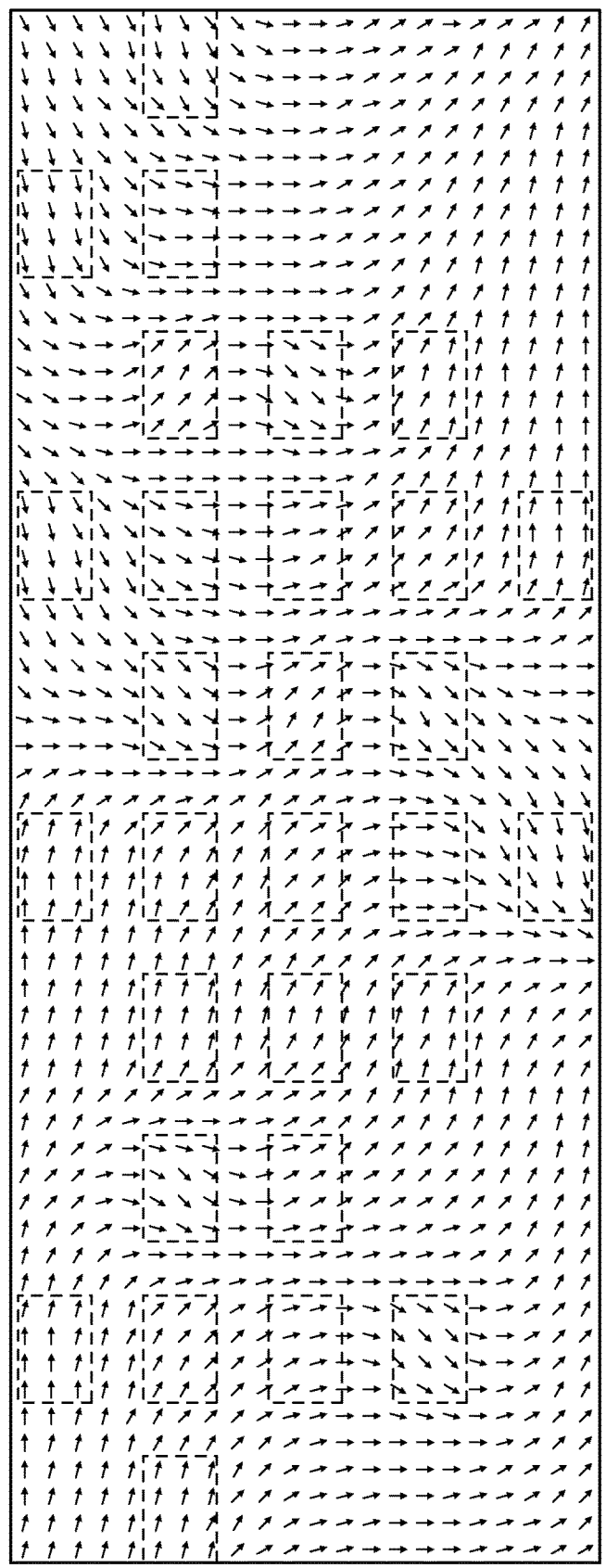
Figures 17A, 17B:
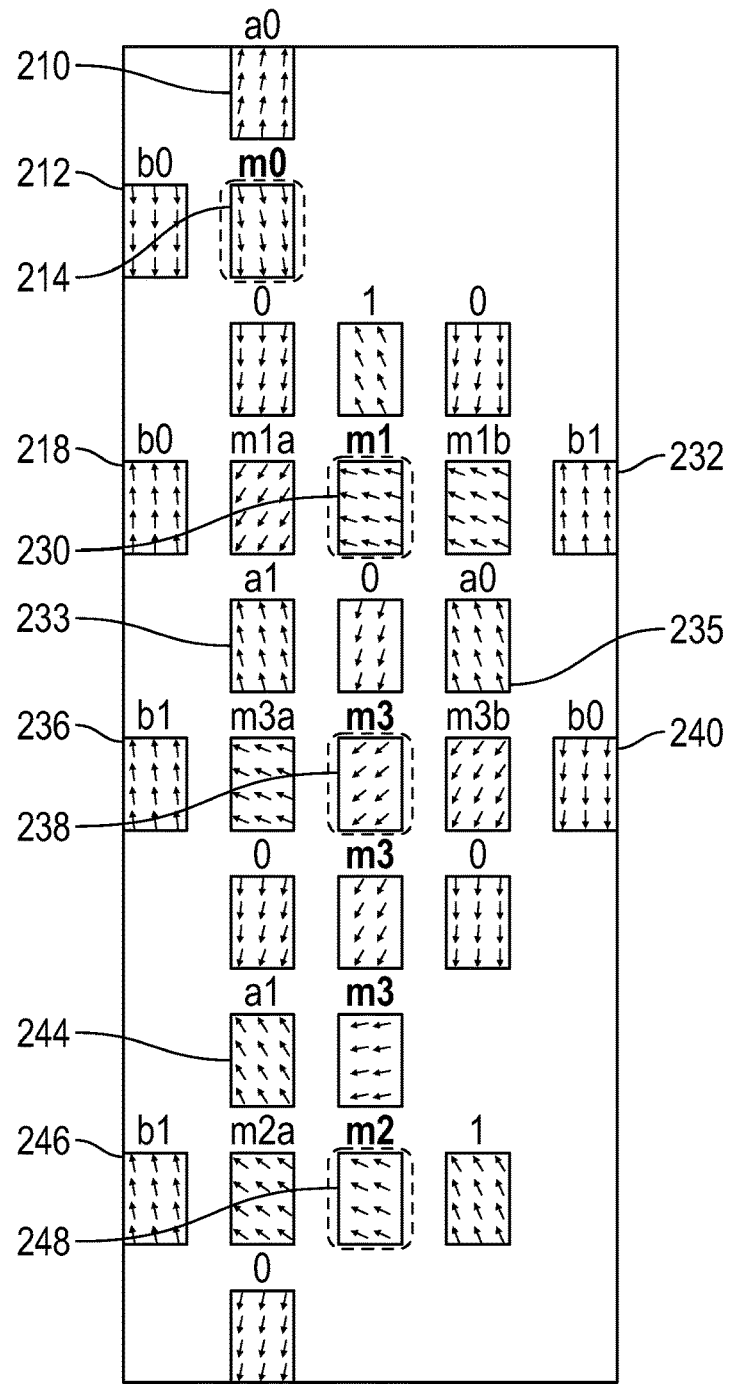
Figure 17C:
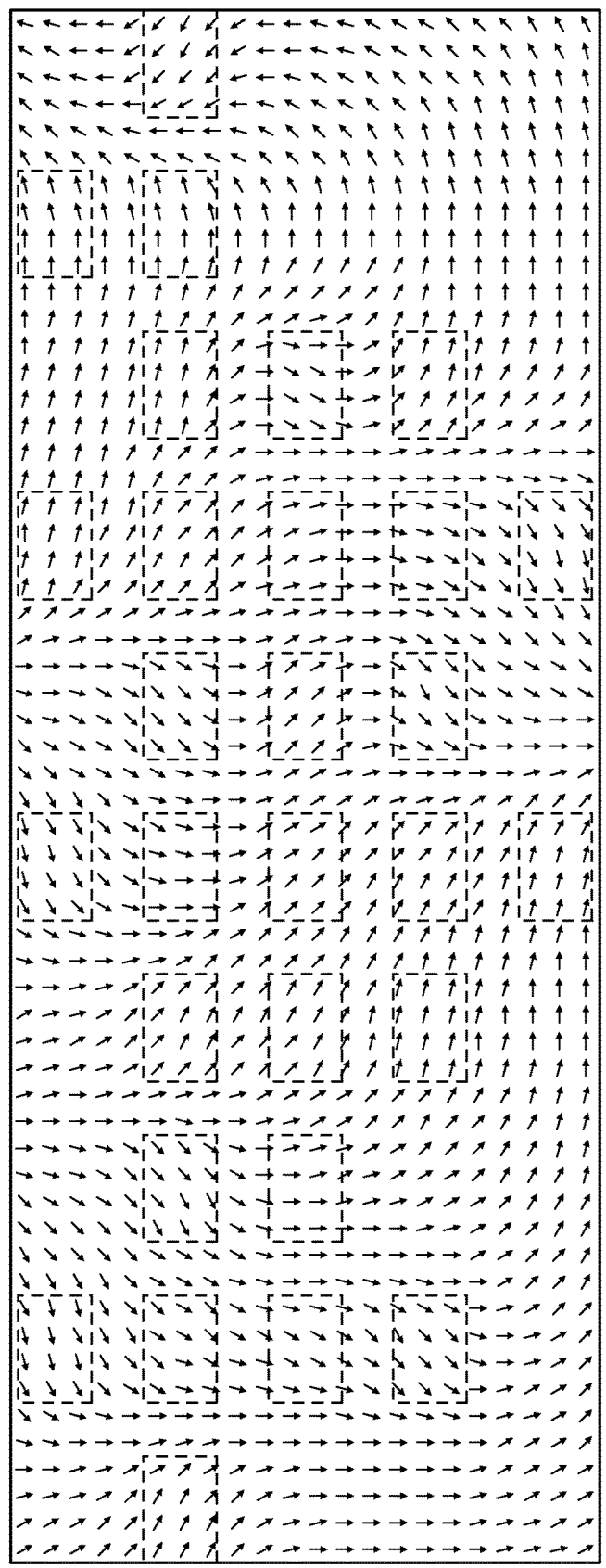
Figures 18A, 18B:
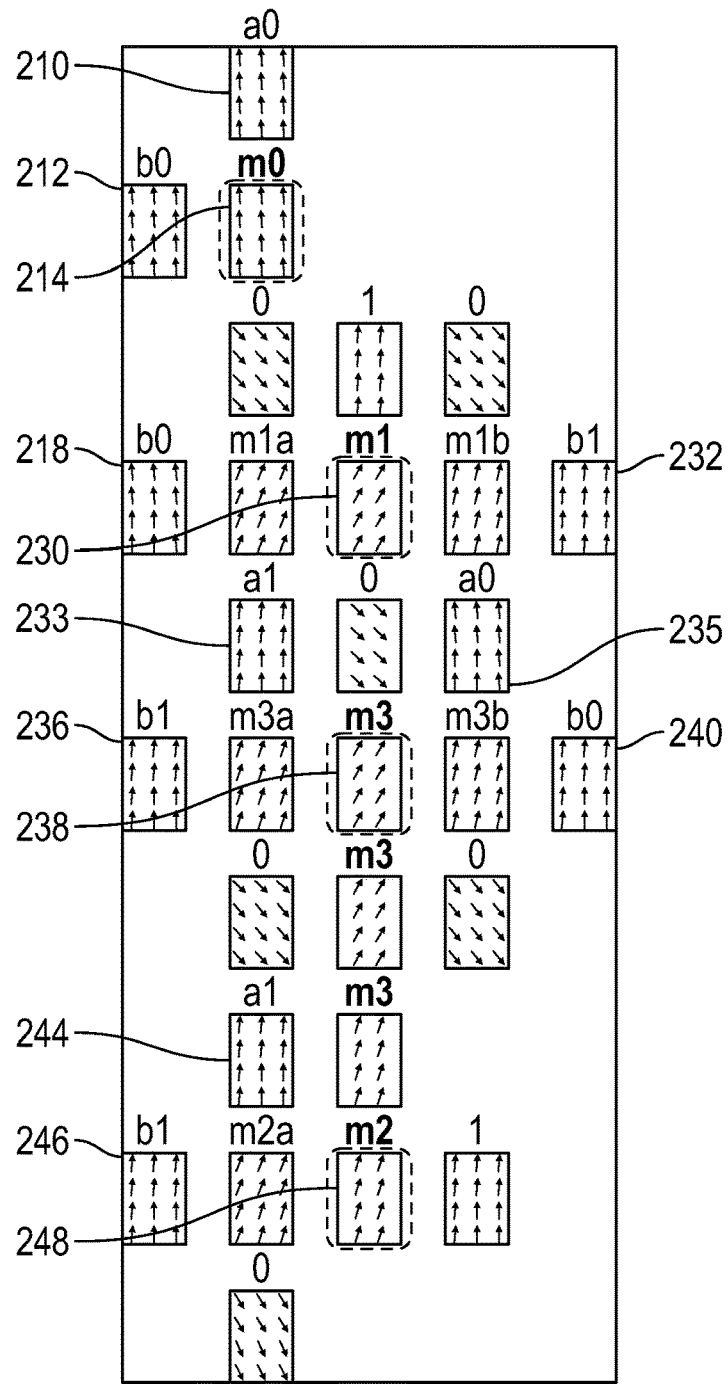
Figure 18C:
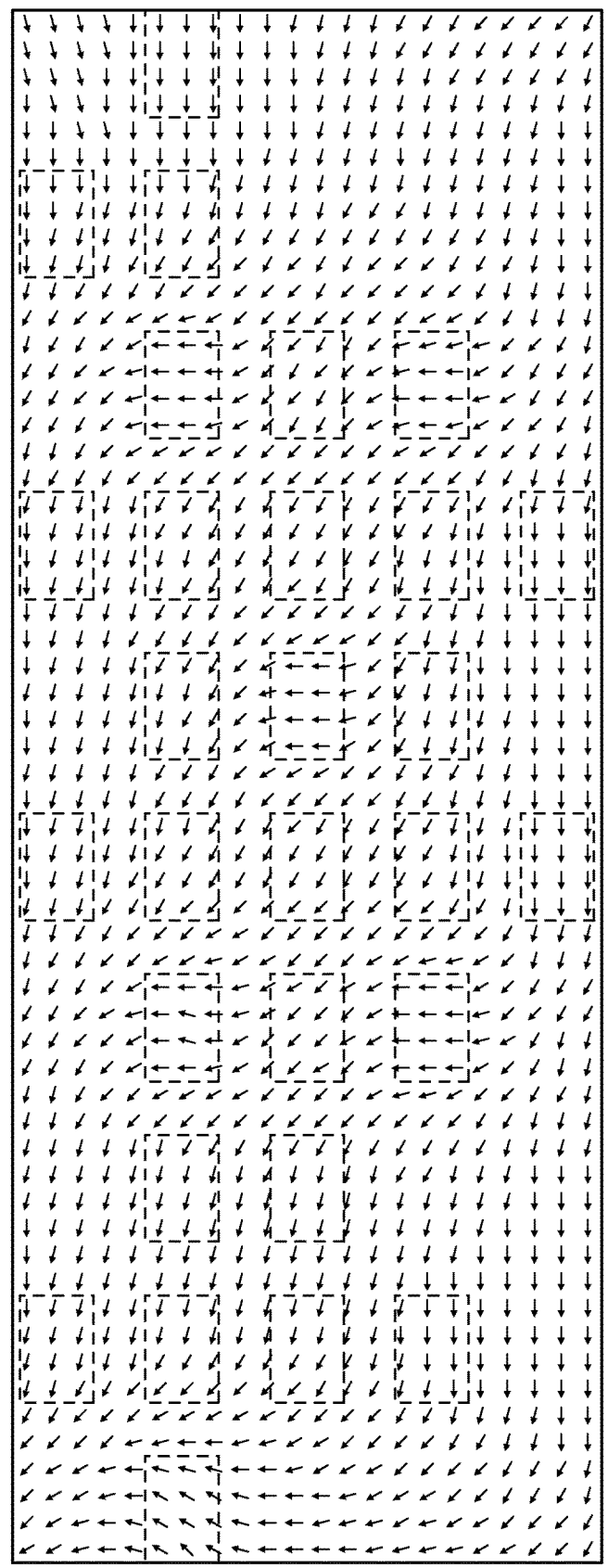

FIG. 1A shows a first ferromagnetic layer 102 separated from a second ferromagnetic layer 106 by a non-magnetic electrically conductive layer 104 such as copper. Where the non-magnetic conductive layer 104 is too thick to invoke the Giant Magneto Resistive (GMR) effect, the two ferromagnetic layers 102 and 106 couple magnetic field in the same direction, resulting in ferromagnetic coupling shown in FIG. 1A, where the X symbols represent the tail of a magnetic field vector perpendicular to the plane of the figure. When the thickness of the conductive layer 104 is reduced to just a few hundred angstroms thick, or a deposition of thickness on the order of 100 copper atomic diameters, the top and bottom layer demonstrate anti-ferromagnetic coupling, and the top 102 magnetic fields are of opposite sense from the bottom 106 magnetic fields, as shown in FIG. 1B with a conductor 108 which is on the order of 100 atomic diameters of copper in thickness. FIGS. 2A and 2B show the anti-ferromagnetic effect applied to the present invention with substrate 202 comprising continuous ferromagnetic layer 204 corresponding to 106 of FIG. 1B and atomic layer thickness conductor 206 corresponding to 108 of FIG. 1B. For an example device with bottom continuous layer 204 and atomic thickness conductor 206, the top layer regions may be formed as a sparse rectangular array having five columns. The first column has ferromagnetic regions b0 212, b0 218, b1 236, and b1 246. The second column has ferromagnetic regions a0 210, m0 214, zero 215, m1 219, a1 233, m3 237, zero 241, a1 244, m2 247, and zero 250. The third column has ferromagnetic regions one 216, m1 230, zero 234, m3 238, m3 242, m3 245, and m2 248. The fourth column has ferromagnetic regions zero 217, m1 231, a0 235, m3 239, zero 243, and one 299. The fifth column has ferromagnetic regions b1 232 and b0 240.

The ferromagnetic regions 204 and the top layer regions of first through fifth column and first through 10th row such as 210, 216, etc may be formed from an alloy such as 80% Nickel (Ni) and 20% Iron (Fe), and the conductive non-ferromagnetic layer 104 may be formed of Ruthenium (Ru), Copper (Cu), or other electrically conductive material. The ferromagnetic regions may be formed in a thickness on the order of 5 nm, and of dimensions on the order of 100 nm×100 nm. In one example of the invention, the conductive non-ferromagnetic layer may be in the range 1 nm to 10 nm thickness, or alternatively, on the order of magnitude of 1 nm to 10 nm thickness.

In the present series of figures, it is understood that the particular convention of logic "1" and "0" is arbitrary so long as uniformly applied, but for clarity in understanding the present examples, a "1" will represent a magnetic field pointing generally upwards toward a top edge of the drawings (or a majority of the field direction is upwards) and in the plane of the drawings, and a "0" will represent a magnetic field pointing downwards (or a majority of the field direction is downwards) and in the plane of the drawings. Other conventions are possible where the "1" and "0" magnetic sense is opposite each other, the convention in the present description is used only for clarity in understanding the invention.

The devices operate with two magnetization inputs for each multiplicand [a1 a0] and [b1 b0] and generate an output [m3 m2 m1 m0]. The multiplier inputs have identical response times, and since the magnetization is stored in the ferromagnetic layer until it is changed, the device does not dissipate any power after the input magnetic field is applied to ferromagnetic inputs a1, a0, b1, and b0. In general, the magnetic field polarizations of the multiplier inputs in the top layer establish anti-ferromagnetic responses in the bottom layer with superposition of the magnetic field surrounding the driven regions to provide a desired anti-ferromagnetic polarity in a top ferromagnetic region to form the four outputs [m3:m0]. The input ferromagnetic layers thereby generate an anti-ferromagnetic response in the bottom ferromagnetic layer, and these anti-ferromagnetic responses generate a superposition of magnetic fields in a region of the bottom layer which is separated from and anti-ferromagnetically coupled to a top layer output ferromagnetic region to form outputs at the various output regions.

The FIGS. 3A, 4A, 5A, 6A, 7A, 8A, 9A, 10A, 11A, 12A, 13A, 14A, 15A, 16A, 17A, and 18A indicate the truth tables for associated input excitations of FIGS. 3B, 4B, 5B, 6B, 7B, 8B, 9B, 10B, 11B, 12B, 13B, 14B, 15B, 16B, 17B, and 18B, respectively, and the continuous bottom ferromagnetic layer generates the anti-magnetic fields shown in corresponding FIGS. 3C, 4C, 5C, 6C, 7C, 8C, 9C, 10C, 11C, 12C, 13C, 14C, 15C, 16C, 17C, and 18C, respectively.

The present examples are provided for illustrative purposes only, and are not intended to limit the invention to only the embodiments shown.

We claim:

1. A multiplier comprising:
a continuous bottom layer of ferromagnetic material separated from a plurality of regions of ferromagnetic material positioned on a plane substantially parallel to the continuous bottom layer;
a thin electrically conductive layer positioned between the continuous bottom layer and the plurality of regions of ferromagnetic material, the thin electrically conductive layer sufficient to induce a reciprocal anti-ferromagnetic response between one of the regions of ferromagnetic material to a corresponding coupled area of the continuous bottom layer of ferromagnetic material;
the plurality of regions of ferromagnetic material arranged as a sparse rectangular array of ferromagnetic regions in a first column, second column, third column, fourth column, and fifth column, the sparse rectangular array having a first row, second row, third row, fourth row, fifth row, sixth row, seventh row, eighth row, ninth row, and tenth row;
the plurality of regions of ferromagnetic material further comprising:
a plurality of input ferromagnetic regions for application of a magnetic field having an orientation parallel to the thin electrically conductive layer, the input ferromagnetic regions comprising:
a first a0 input ferromagnetic region, a second a0 input ferromagnetic region, a first a1 input ferromagnetic region, a second a1 input ferromagnetic region, a first b0 input ferromagnetic region, a second b0 input ferromagnetic region, a third b0 input ferromagnetic region, a first b1 input ferromagnetic region, a second b1 input ferromagnetic region, and a third b1 input ferromagnetic region;
a plurality of output regions configured to generate an output according to an orientation of a magnetic field in a respective region, the output regions comprising:
an m0 output ferromagnetic region, an m1 output ferromagnetic region, an m2 output ferromagnetic region, and a plurality of m3 output ferromagnetic regions comprising a first m3 output ferromagnetic region, a second m3 output ferromagnetic region, and a third m3 output ferromagnetic region;
a plurality of fixed value ferromagnetic regions, the fixed value ferromagnetic regions having either a one value or a zero value;
where a one magnetic value in a particular region corresponds to a magnetic field having a first direction and a zero magnetic value corresponds to a magnetic field in the particular region having a second direction opposite the first direction;
the first row having the first a0 input ferromagnetic region at the second column;
the second row having the first b0 input ferromagnetic region at the first column and the m0 output ferromagnetic region at the second column;
the third row having a zero ferromagnetic region in the second and fourth columns and a one ferromagnetic region in the third column;
the fourth row having the second b0 input ferromagnetic region at the first column, the m1 output ferromagnetic region at the third column, and the first b1 input ferromagnetic region at the fifth column;
the fifth row having the first a1 input ferromagnetic region at the second column, a zero ferromagnetic region at the third column, and the second a0 input ferromagnetic region at the fourth column;
the sixth row having the second b1 input ferromagnetic region at the first column, the first m3 output ferromagnetic region at the third column, and the third b0 input ferromagnetic region at the fifth column;
the seventh row having a zero ferromagnetic region at the second and fourth columns, and the second m3 output ferromagnetic region at the third column;
the eighth row having the second a1 input ferromagnetic region at the second column and the third m3 output ferromagnetic region at the third column;
the ninth row having the b1 input ferromagnetic region at the first column, the m2 output ferromagnetic region at the third column, and a one ferromagnetic region at the fourth column;
the tenth row having a zero ferromagnetic region at the second column;

and where the first and second a0 input ferromagnetic region, the first and second a1 input ferromagnetic regions, the first, second, and third b0 input ferromagnetic regions, and the first, second, and third b1 input ferromagnetic regions are configured to perform mathematical multiplications by application of a magnetic field oriented in the first direction for a logic one and by application of a magnetic field in the second direction for a logic zero;

the multiplier configured to generate output values as a magnetic field direction of:
the m0 output ferromagnetic region,
the m1 output ferromagnetic region, and;
at least one of the first, second, and third m3 output ferromagnetic regions.

2. The multiplier of claim 1 where each of the output ferromagnetic regions are configured to generate an output which is "1" when a magnetic field in a respective output ferromagnetic region is sensed in the first direction and generate an output which is "0" when the respective output ferromagnetic region magnetic field is sensed in the second direction.

3. The multiplier of claim 1 where the ferromagnetic material is at least one of an alloy of approximately 80% Ni and approximately 20% Fe.

4. The multiplier of claim 1 where the ferromagnetic material has a thickness on the order of 1 nm, or a thickness on the order of 10 nm.

5. The multiplier of claim 1 where the non-ferromagnetic electrical conductor comprises Copper or Ruthenium.

6. The multiplier of claim 1 where the electrical conductor comprises a non-ferromagnetic material.

7. The multiplier of claim 6 where the non-ferromagnetic electrical conductor has a thickness on the order of 5 nm.

8. The multiplier of claim 1 where at least one said ferromagnetic region of the plurality of regions of ferromagnetic material has a rectangular shape.

9. The multiplier of claim 1 where the output value comprises a magnetization direction of the m0 output ferromagnetic region, the m1 output ferromagnetic region, the m2 output ferromagnetic region, and at least one of the first m3 output ferromagnetic region, second m3 output ferromagnetic region, or third m3 output ferromagnetic region.

10. The multiplier of claim 1 where the plurality of ferromagnetic regions further comprises an m1a ferromagnetic region located at the fourth row and second column, and an m1b ferromagnetic region located at the fourth row and fourth column.

11. The multiplier of claim 1 where the plurality of ferromagnetic regions further comprises an m3a ferromagnetic region located at the sixth row and second column, and an m3b ferromagnetic region located at the sixth row fourth column.

12. A ferromagnetic multiplier comprising:
a continuous lower layer of ferromagnetic material;
a thin conductive layer positioned adjacent to the continuous lower layer of ferromagnetic material;
a plurality of ferromagnetic regions on a layer adjacent to the thin conductive layer, the plurality of ferromagnetic regions arranged in a sparse rectangular array having a first column, a second column, a third column, a fourth column, and a fifth column, the sparse rectangular array also having a first row, a second row, a third row, a fourth row, a fifth row, a sixth row, a seventh row, an eighth row, a ninth row, and a tenth row;

the plurality of ferromagnetic regions further comprising:
input ferromagnetic regions comprising: a multiplier first input having a low order an a0 bit input formed as a plurality of ferromagnetic regions in the second column first row and fourth column fifth row of the sparse rectangular array;
the multiplier first input having a high order a1 bit input formed as a plurality of ferromagnetic regions in the sparse rectangular array further comprising ferromagnetic regions in the second column fifth row and second column eighth row;
a multiplier second input having a low order b0 bit input formed as a plurality of individual ferromagnetic regions in the first column second row, first column fourth row, and fifth column sixth row;
the multiplier second input having a high order b1 bit input formed as a plurality of individual ferromagnetic regions in the first column sixth row, first column ninth row, and fifth column fourth row;
constant value ferromagnetic regions comprising:
a one value ferromagnetic region located at the third column third row and a one value ferromagnetic region located at the fourth column ninth row;
a plurality of zero value ferromagnetic regions located at the second column, third and seventh rows, third column fifth row, and fourth column third and seventh row;
a plurality of output ferromagnetic regions comprising:
an m0 output bit formed by a magnetization direction of a ferromagnetic region in the second column second row;
an m1 output bit formed by a magnetization direction of a ferromagnetic region in the third column fourth row;
an m2 output bit formed by a magnetization direction of a ferromagnetic region in the third column ninth row;
an m3 output bit formed by a magnetization direction of a ferromagnetic region in at least one of: the third column sixth, seventh, or eighth rows;
and where the one value comprises a first magnetization direction in an orientation parallel to a long axis of the sparse rectangular array and the zero value comprises a magnetization direction in an opposite direction of the first magnetization direction.

13. The ferromagnetic multiplier of claim 12 where said plurality of ferromagnetic regions further comprises an m1a ferromagnetic region at the second column fourth row and an m1b ferromagnetic region at the fourth column fourth row.

14. The ferromagnetic multiplier of claim 12 where said plurality of ferromagnetic regions further comprises an m3a ferromagnetic region at the second column sixth row and an m3b ferromagnetic region at the fourth column sixth row.

15. The ferromagnetic multiplier of claim 12 where the magnetization fields are sensed as "1" in the first direction and "0" in the second direction.

16. The ferromagnetic multiplier of claim 12 where the ferromagnetic material is at least one of an alloy of approximately 80% Ni and approximately 20% Fe.

17. The ferromagnetic multiplier of claim 12 where the ferromagnetic material has a thickness on the order of 1 nm or on the order of 10 nm.

18. The ferromagnetic multiplier of claim 12 where the thin conductive layer is Copper or Ruthenium.

19. The ferromagnetic multiplier of claim 12 where the thin conductive layer is a non-ferromagnetic material.

20. The ferromagnetic multiplier of claim 19 where the thin conductive layer has a thickness on the order of 5 nm.

\* \* \* \* \*